United States Patent
Miyabe et al.

(10) Patent No.: US 8,883,391 B2
(45) Date of Patent: Nov. 11, 2014

(54) POSITIVE TYPE PHOTOSENSITIVE RESIN COMPOSITION

(75) Inventors: Tomotsugu Miyabe, Otsu (JP); Yoji Fujita, Otsu (JP)

(73) Assignee: Toray Industries, Inc., Tokyo (JP)

( * ) Notice: Subject to any disclaimer, the term of this patent is extended or adjusted under 35 U.S.C. 154(b) by 56 days.

(21) Appl. No.: 13/514,932

(22) PCT Filed: Dec. 7, 2010

(86) PCT No.: PCT/JP2010/071888
§ 371 (c)(1), (2), (4) Date: Jun. 14, 2012

(87) PCT Pub. No.: WO2011/080992
PCT Pub. Date: Jul. 7, 2011

(65) Prior Publication Data
US 2012/0251949 A1 Oct. 4, 2012

(30) Foreign Application Priority Data
Dec. 28, 2009 (JP) .................. 2009-296800

(51) Int. Cl.

| | |
|---|---|
| *G03F 7/023* | (2006.01) |
| *C08L 79/08* | (2006.01) |
| *C08G 73/10* | (2006.01) |
| *G03F 7/075* | (2006.01) |
| *C08K 5/29* | (2006.01) |
| *C08K 5/5425* | (2006.01) |
| *C08K 5/5435* | (2006.01) |

(52) U.S. Cl.
CPC ............... *C08L 79/08* (2013.01); *C08G 73/10* (2013.01); *G03F 7/0233* (2013.01); *G03F 7/0751* (2013.01); *C08K 5/29* (2013.01); *C08K 5/5425* (2013.01); *C08K 5/5435* (2013.01)
USPC ............ 430/165; 430/191; 430/192; 430/193

(58) Field of Classification Search
CPC ................................... G03F 7/0233
USPC .................. 430/165, 191, 192, 193
See application file for complete search history.

(56) References Cited

U.S. PATENT DOCUMENTS

| | | | |
|---|---|---|---|
| 7,455,948 B2 * | 11/2008 | Taniguchi et al. | 430/176 |
| 7,507,518 B2 * | 3/2009 | Fujita et al. | 430/157 |
| 2006/0110680 A1 * | 5/2006 | Taniguchi et al. | 430/270.1 |
| 2009/0170026 A1 * | 7/2009 | Sugiyama et al. | 430/270.1 |
| 2009/0208870 A1 | 8/2009 | Ozaki et al. | |

FOREIGN PATENT DOCUMENTS

| | | |
|---|---|---|
| JP | 2004-124054 A | 4/2004 |
| JP | 2005-43883 A | 2/2005 |
| JP | 2008-83124 A | 4/2008 |
| JP | 2008-191574 A | 8/2008 |
| JP | 2009-192851 A | 8/2009 |

OTHER PUBLICATIONS

International Search Report issued in PCT/JP2010/071888, mailed Jan. 18, 2011.

* cited by examiner

*Primary Examiner* — John Chu
(74) *Attorney, Agent, or Firm* — Birch, Stewart, Kolasch & Birch, LLP

(57) ABSTRACT

Disclosed is a positive-type photosensitive resin composition which has excellent storage stability, particularly excellent sensitivity stability, and can be formed into a cured film having excellent adhesion onto a substrate when heated at 350° C. or higher or heated in the air. The positive-type photosensitive resin composition comprises (a) a polymer having, as the main component, at least one structure selected from the group consisting of a polyimide precursor structure, a polybenzoxazole precursor structure, and a polyimide structure, (b) a quinonediazide compound, (c) a silane coupling agent having a styryl group, (d) a silane coupling agent having an epoxy group, an oxetanyl group, a methacryloxy group, an acryloxy group, an amino group, an amide group or mercapto group and an alkoxysilyl group, and (e) a solvent.

4 Claims, No Drawings

POSITIVE TYPE PHOTOSENSITIVE RESIN COMPOSITION

TECHNICAL FIELD

The present invention relates to a positive-type photosensitive resin composition. More particularly, it relates to a positive-type photosensitive resin composition which is suitable for an insulating layer of a surface protective film, an interlayer dielectric film, an organic electro-luminescent device and the like of a semiconductor device.

BACKGROUND ART

Heat-resistant resins such as polyimide and polybenzoxazole are used for surface protective films, interlayer dielectric films and the like of semiconductor devices such as LSI (Large Scale Integration; large scale integration circuits) because they have excellent heat resistance and electrical insulating properties. With miniaturization of semiconductor devices, surface protective films, interlayer dielectric films and the like are required to have a resolution of several micrometers. Thus, in these applications, positive-type photosensitive polyimide compositions and photosensitive polybenzoxazole compositions that can be microprocessed are used. When a heat-resistant resin such as polyimide or polybenzoxazole is used for a surface protective film or an interlayer dielectric film, resin after heat curing remains in a device as a permanent film, and therefore the adhesion property between a resin composition after heat curing and a substrate used as a base of the device is very important.

For improving adhesion with a base after high-temperature heating treatment or heating treatment under a high-oxygen concentration environment, there has been proposed a heat-resistant resin precursor composition containing a heat-resistant resin precursor and a silane coupling agent with a specific structure which has an aromatic ring (see, for example, Patent Literature 1). As a positive-type photosensitive resin composition which combines photo sensitivity stability and chemical resistance with adhesion, there has been proposed a positive-type photosensitive resin composition containing a heat-resistant resin precursor, a quinonediazide compound, an alkoxymethyl group-containing compound, an aminosilane compound having a specific structure and a solvent (see, for example, Patent Literature 2). On the other hand, as a photosensitive resin precursor composition having excellent stability of a sensitivity and resolution after exposure, there has been proposed a photosensitive resin precursor composition containing a heat-resistant resin precursor, two or more photo acid generating agents and an alkoxymethyl group-containing compound (see, for example, Patent Literature 3).

PRIOR ART DOCUMENTS

Patent Literatures

Patent Literature 1: Japanese Patent Laid-Open No. 2004-124054
Patent Literature 2: Japanese Patent Laid-Open No. 2008-83124
Patent Literature 3: Japanese Patent Laid-Open No. 2005-43883

DISCLOSURE OF THE INVENTION

Problems to be Solved by the Invention

The above-mentioned known photosensitive resin compositions can improve the adhesion property with a substrate after heating treatment, but have poor storage stability and has a problem of reduced sensitivity in particular. Typical silane coupling agents mostly have a functional group such as an amino group bound with an alkoxysilyl group by an aliphatic hydrocarbon group, and are thus easily decomposed by heating treatment in the air or high-temperature heating treatment. Accordingly, a cured film formed by a positive-type photosensitive resin composition containing such a silane coupling agent has the problem that the adhesion property with a substrate is considerably reduced after high-temperature heating treatment or heating treatment in the air. Thus, an object of the present invention is to provide a positive-type photosensitive resin composition which has excellent storage stability, particularly excellent photo sensitivity stability, and can be formed into a cured film having an excellent adhesion property with a substrate after high-temperature heating treatment at 350° C. or higher or after heating treatment in the air.

Solution to Problems

The present invention is a positive-type photosensitive resin composition which comprises (a) a polymer having, as a main component, a structure represented by the following general formula (1) and/or a polymer having, as a main component, a structure represented by the following general formula (2), (b) a quinonediazide compound, (c) a silane coupling agent having a structure represented by the following general formula (3), (d) a silane coupling agent having an epoxy group, an oxetanyl group, a methacryloxy group, an acryloxy group, an amino group, an amide group or a mercapto group and having an alkoxysilyl group and (e) a solvent.

[Chemical Formula 1]

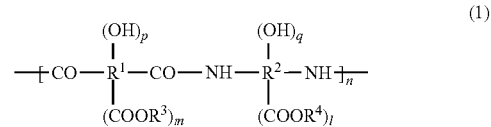

In the above general formula (1), $R^1$ and $R^2$ each independently represent a bi- to octavalent organic group having two or more carbon atoms. $R^3$ and $R^4$ each independently represent hydrogen or a monovalent organic group having 1 to 20 carbon atoms. n represents a number in the range of 10 to 100,000. l and m each independently represent an integer of 0 to 2, and p and q each independently represent an integer of 0 to 4, where p+q>0.

[Chemical Formula 2]

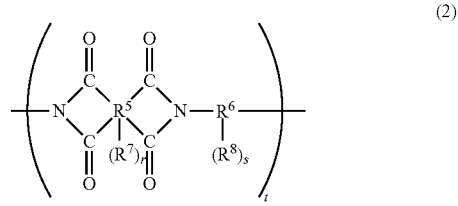

In the above general formula (2), $R^5$ represents a tetra- to decavalent organic group and $R^6$ represents a bi- to octavalent organic group. $R^7$ and $R^8$ represent a phenolic hydroxyl group, a sulfonic acid group or a thiol group, and may each be a single group or a combination of different groups. t represents a number in the range of 3 to 100,000. r and s represent an integer of 0 to 6.

[Chemical Formula 3]

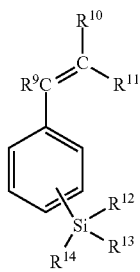

(3)

In the above general formula (3), $R^9$ to $R^{11}$ represent hydrogen or an alkyl group having 1 to 3 carbon atoms. $R^{12}$ to $R^{14}$ each independently represent an alkyl group having 1 to 6 carbon atoms, an alkenyl group having 2 to 4 carbon atoms, a phenyl group, a substituted phenyl group or an alkoxyl group having 1 to 6 carbon atoms, and at least one of $R^{12}$ to $R^{14}$ is an alkoxyl group having 1 to 6 carbon atoms.

Advantages of the Invention

According to the present invention, there can be obtained a positive-type photosensitive resin composition having excellent storage stability, particularly excellent photo sensitivity stability. In addition, by the positive-type photosensitive resin composition of the present invention, there can be obtained a cured film having an excellent adhesion property with a substrate after high-temperature heating treatment at 350° C. or higher or after heating treatment in the air.

MODE FOR CARRYING OUT THE INVENTION

A photosensitive resin composition of the present invention contains (a) a polymer having, as a main component, a structure represented by the following general formula (1) and/or a polymer having, as a main component, a structure represented by the following general formula (2). Preferable are a polyimide resin, a polyamide acid or polyamide acid ester as a polyimide precursor, and a polyhydroxyamide as a polybenzoxazole precursor, which have excellent heat resistance and solvent resistance. Here, "main component" in a polymer having, as a main component, a structure represented by the following general formula (1) means that the structural unit within the parenthesis which is shown as n repeating units in the following general formula (1) is contained in an amount of 50 mol % or more of all structural units of the polymer. The main component is contained in an amount of preferably 70 mol % or more, more preferably 90 mol % or more. "Main component" in a polymer having, as a main component, a structure represented by the following general formula (2) means that the structural unit within the parenthesis which is shown as t repeating units in the following general formula (2) is contained in an amount of 50 mol % or more of all structural units of the polymer. The main component is contained in an amount of preferably 70 mol % or more, more preferably 90 mol % or more.

[Chemical Formula 4]

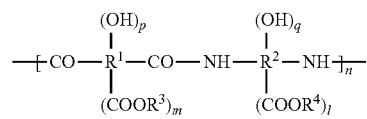

(1)

In the above general formula (1), $R^1$ and $R^2$ each independently represent a bi- to octavalent organic group having two or more carbon atoms. $R^3$ and $R^4$ each independently represent hydrogen or a monovalent organic group having 1 to 20 carbon atoms. n represents a number in the range of 10 to 100,000. l and m each independently represent an integer of 0 to 2, and p and q each independently represent an integer of 0 to 4, where p+q>0.

[Chemical Formula 5]

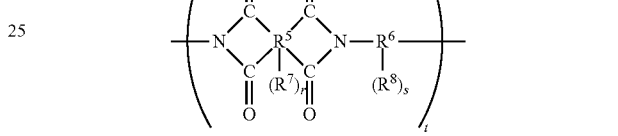

(2)

In the above general formula (2), $R^5$ represents a tetra- to decavalent organic group and $R^6$ represents a bi- to octavalent organic group. $R^7$ and $R^8$ represent a phenolic hydroxyl group, a sulfonic acid group or a thiol group, and may each be a single group or a combination of different groups. t represents a number in the range of 3 to 100,000. r and s represent an integer of 0 to 6.

The polymer of (a) component that is used for the photosensitive resin composition of the present invention may consist of only one of structural units represented by general formulae (1) and (2), or a combination of both the structural units.

The presence of fluorine atoms within the structural unit represented by general formula (1) or (2) is preferable as water repellency is imparted to a film boundary to suppress penetration through the boundary at the time of development with an aqueous alkali solution. The fluorine atom content for each of the polyimide having a structural unit represented by general formula (1) and the polyimide precursor having a structural unit represented by general formula (2) is preferably 10% by weight or more for adequately providing an effect of preventing penetration through the boundary, and preferably 20% by weight or less from a viewpoint of solubility in an aqueous alkali solution.

In the above general formula (1), $R^1$ represents a bi- to octavalent organic group having two or more carbon atoms, and denotes a structural component of an acid. The acids where $R^1$ is bivalent may include aromatic dicarboxylic acids such as terephthalic acid, isophthalic acid, diphenyletherdicarboxylic acid, naphthalenedicarboxylic acid and bis(carboxyphenyl)propane and aliphatic dicarboxylic acids such as cyclohexanedicarboxylic acid and adipic acid. The acids where $R^1$ is trivalent may include tricarboxylic acids such as trimellitic acid and trimesic acid. The acids where $R^1$ is tetravalent may include aromatic tetracarboxylic acids such as pyromellitic acid, benzophenonetetracarboxylic acid, biphenyltetracarboxylic acid, diphenylethertetracarboxylic acid and diphenylsulfonetetracarboxylic acid, aliphatic tetracarboxylic acids such as butanetetracarboxylic acid and cyclopentanetetracarboxylic acid, and diester compounds with hydrogen atoms of two carboxyl groups of such a tetracarboxylic acid replaced by methyl groups or ethyl groups. In addition, mention may be made of acids having hydroxyl groups, such as hydroxyphthalic acid and hydroxytrimellitic acid. Two or more kinds of these acid components may be used, but 1 to 40 mol % of tetracarboxylic residue is preferably contained. Preferably, 50 mol % or more of residue of acid having a hydroxyl group is contained from a viewpoint of solubility in an alkali developer and photo sensitivity.

$R^1$ preferably has an aromatic ring from a viewpoint of heat resistance, and is further preferably a trivalent or tetravalent organic group having 6 to 30 carbon atoms. Preferred examples of the structure of $R^1(COOR^3)_m (OH)_p$ of general formula (1) include the structure shown below.

dicarboxyphenyl)methane dianhydride, bis(3,4-dicarboxyphenyl) sulfone dianhydride, bis(3,4-dicarboxyphenyl)ether dianhydride, 1,2,5,6-naphthalenetetracarboxylic dianhydride, 9,9-bis(3,4-dicarboxyphenyl)fluorensic dianhydride, 9,9-bis{4-(3,4-dicarboxyphenoxy)phenyl}fluorensic dianhydride, 2,3,6,7-naphthalenetetracarboxylic dianhydride, 2,3,5,6-pyridinetetracarboxylic dianhydride, 3,4,9,10-perylenetetracarboxylic dianhydride and 2,2-bis(3,4-dicarboxyphenyl)hexafluoropropane dianhydride, aliphatic tetracarboxylic dianhydrides such as butanetetracarboxylic dianhydride and 1,2,3,4-cyclopentanetetracarboxylic dianhydride, 3,3',4,4'-diphenylsulfonetetracarboxylic dianhydride and acid dianhydrides having the structure shown below. They are used alone or in combination of two or more kinds.

[Chemical Formula 6]

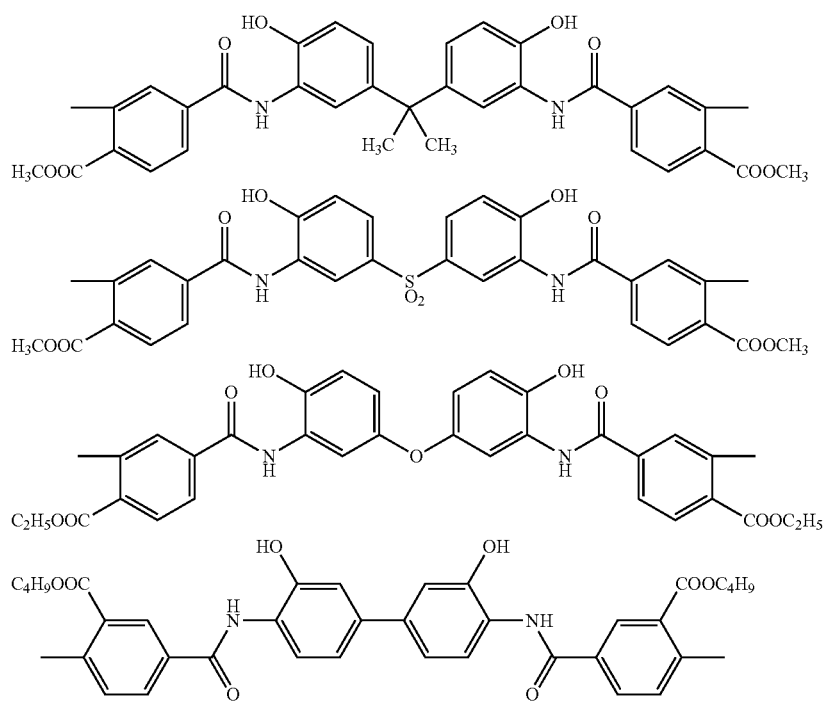

In the above general formula (2), $R^5$ represents a residue of an acid dianhydride and is a tetra- to decavalent organic group. Above all preferable is an organic group containing an aromatic ring or a cyclic aliphatic group and having 5 to 40 carbon atoms.

The acid dianhydrides may include, specifically, aromatic tetracarboxylic dianhydrides such as pyromellitic dianhydride, 3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-

[Chemical Formula 7]

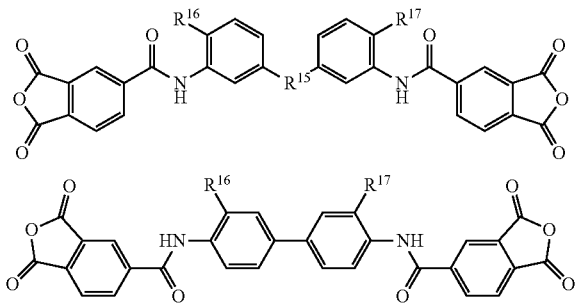

$R^{15}$ represents an oxygen atom, $C(CF_3)_2$, $C(CH_3)_2$ or $SO_2$, and $R^{16}$ and $R^{17}$ represent a hydrogen atom, a hydroxyl group or a thiol group.

Among them, preferable are 3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxyphenyl) sulfone dianhydride, bis(3,4-dicarboxyphenyl)ether dianhydride, 2,2-bis(3,4-dicarboxyphenyl)hexafluoropropane dianhydride, 3,3',4,4'-diphenylsulfonetetracarboxylic dianhydride, 9,9-bis(3,4-dicarboxyphenyl)fluorensic dianhydride 9,9-bis{4-(3,4-dicarboxyphenoxy)phenyl}fluorensic dianhydride and acid dianhydrides having the structure shown below.

[Chemical Formula 8]

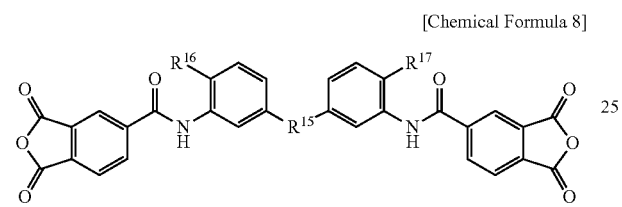

$R^{15}$ represents an oxygen atom, $C(CF_3)_2$, $C(CH_3)_2$ or $SO_2$, and $R^{16}$ and $R^{17}$ represent a hydrogen atom, a hydroxyl group or a thiol group.

$R^2$ in general formula (1) and $R^6$ in general formula (2) represent a bi- to octavalent organic group having two or more carbon atoms, and denote a structural component of a diamine. $R^2$ preferably has an aromatic ring from a viewpoint of heat resistance. Specific examples of diamines may include 3,4'-diaminodiphenyl sulfide, 4,4'-diaminodiphenyl sulfide, benzine, 1,5-naphthalenediamine, 2,6-naphthalenediamine, bis(4-aminophenoxy)biphenyl, bis{4-(4-aminophenoxy)phenyl}ether, 1,4-bis(4-aminophenoxy)benzene, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, 2,2'-di(trifluoromethyl)-4,4'-diaminobiphenyl, 9,9-bis(4-aminophenyl)fluorene, phenylenediamines such as m-phenylenediamine and p-phenylenediamine, diaminodiphenyl ethers such as 3,4'-diaminodiphenylether and 4,4'-diaminodiphenylether, aminophenoxybenzenes such as 1,4-bis(4-aminophenoxy)benzene, diaminodiphenylmethanes such as 3,4'-diaminodiphenylmethane and 4,4'-diaminodiphenylmethane, diaminodiphenylsulfones such as 3,4'-diaminodiphenylsulfone and 4,4'-diaminodiphenylsulfone, bis(trifluoromethyl)benzidine, bis(aminophenoxyphenyl)propane, bis(aminophenoxyphenyl)sulfones such as bis(4-aminophenoxyphenyl)sulfone and bis(3-aminophenoxyphenyl)sulfone, bis(amino-hydroxyphenyl)hexafluoropropane, diaminodihydroxypyrimidine, diaminohydroxypyridine, hydroxy-diamino-pyrimidine, diaminophenol, dihydroxybenzidine, diaminobenzoic acid, diaminoterephthalic acid, compounds with at least some of hydrogen atoms of the aromatic ring replaced by alkyl groups and halogen atoms, aliphatic cyclohexyldiamine, methylenebiscyclohexylamine, hexamethylenediamine and diamines having the structure shown below.

[Chemical Formula 9]

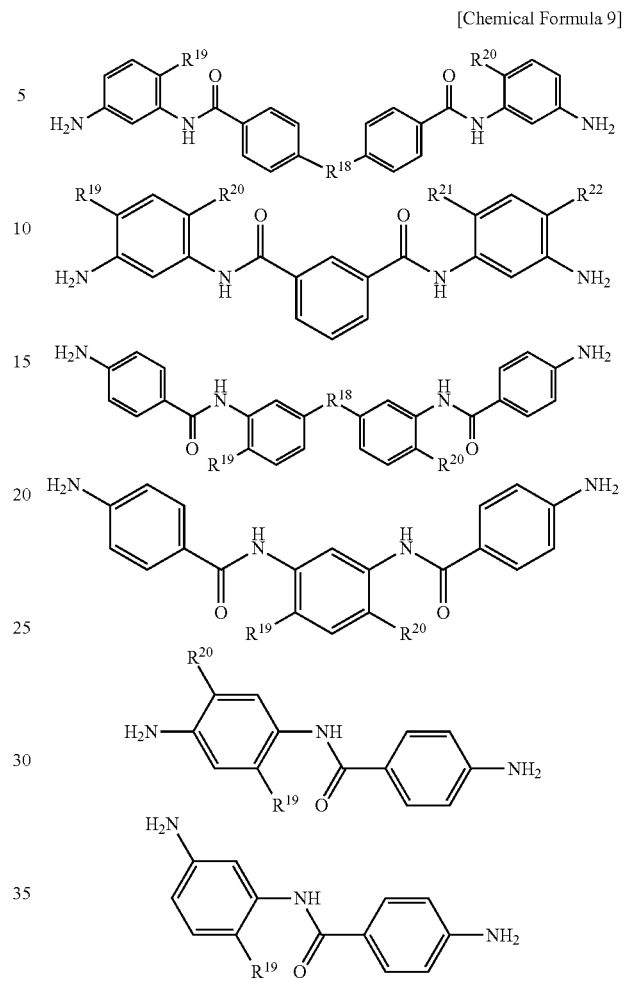

$R^{18}$ represents an oxygen atom, $C(CF_3)_2$, $C(CH_3)_2$ or $SO_2$, and $R^{19}$ to $R^{22}$ represent a hydrogen atom, a hydroxyl group or a thiol group.

In addition, mention may be made of those in which $R^2(COOR^4)_t(OH)_q$ of formula (1) is represented by the following structure. Among them preferable are those in which $R^2(COOR^4)_t(OH)_q$ of general formula (1) is represented by the following structure. Two or more kinds of these diamine components may be used, but 60 mol % or more of diamine residue having a hydroxyl group is preferably contained from a viewpoint of solubility in an alkali developer.

[Chemical Formula 10]

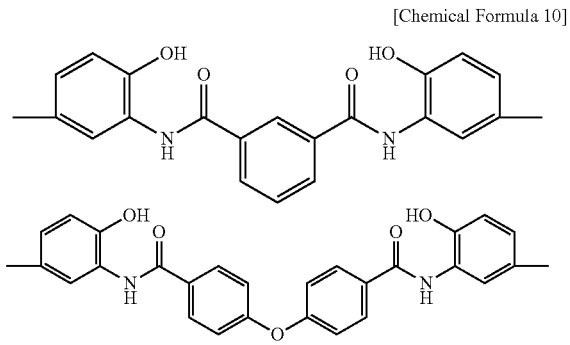

-continued

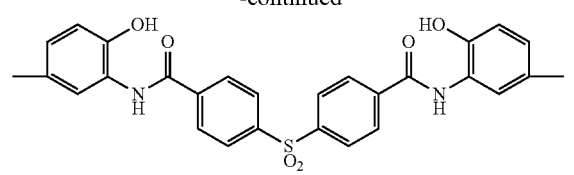

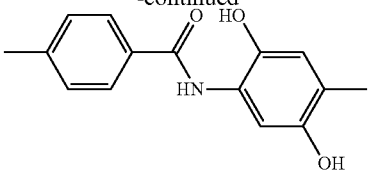

[Chemical Formula 11]

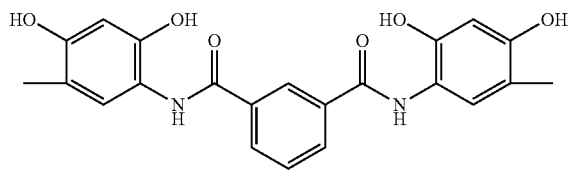

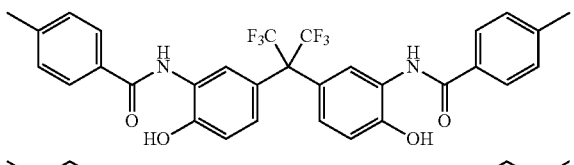

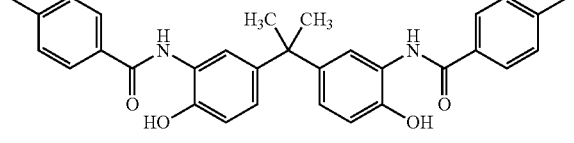

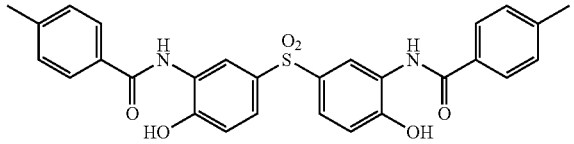

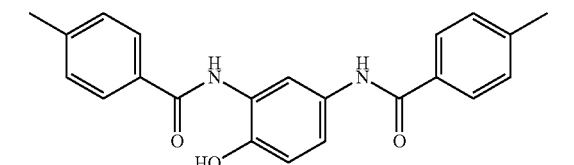

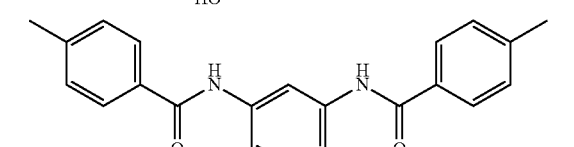

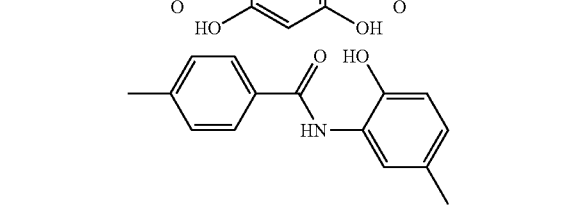

$R^3$ and $R^4$ in general formula (1) may each be same or different, and represent hydrogen or a monovalent organic group having 1 to 20 carbon atoms. Preferably, hydrogen atoms constitute 10 to 90 mol % of each of $R^3$ and $R^4$ from a viewpoint of solubility in an alkali developer and solution stability of a photosensitive resin composition obtained. Further, more preferably, $R^3$ and $R^4$ each contain at least one monovalent hydrocarbon group having 1 to 16 carbon atoms, with the remainder constituted by hydrogen atoms.

l and m in general formula (1) represent the number of carboxyl groups or ester groups, and each independently represents an integer of 0 to 2. They preferably represent 1 or 2. p and q in general formula (1) each independently represent an integer of 0 to 4, where p+q>0. n in general formula (1) represents the number of repetitions of structural units of a polymer, and is in the range of 10 to 100,000. If n is less than 10, the solubility of a polymer in an alkali developer may become so high that a contrast between an exposed area and an unexposed area cannot be obtained and a desired pattern cannot be formed. On the other hand, if n is greater than 100,000, the solubility of a polymer in an alkali developer may become so low that an exposed area is not dissolved and a desired pattern cannot be formed. n is preferably 1,000 or less, more preferably 100 or less from a viewpoint of the solubility of a polymer in an alkali developer. n is preferably 20 or more from a viewpoint of improvement of the elongation.

In general formula (2), $R^7$ and $R^8$ represent a phenolic hydroxyl group, a sulfonic acid group or a thiol group, and r and s represent the numbers of $R^7$ and $R^8$ groups, respectively. r and s are preferably 4 or less from a viewpoint of the stability of the photosensitive resin composition solution obtained. r+s is preferably greater than 0 from a viewpoint of the solubility of a polymer in an alkali developer.

t in general formula (2) represents the number of repetitions of structural units of a polymer, and is preferably 3 or more, more preferably 5 or more. If t is less than 3, the solubility of a polymer in an alkali developer may become so high that a contrast between an exposed area and an unexposed area cannot be obtained and a desired pattern cannot be formed. On the other hand, if t is greater than 100,000, the solubility of a polymer in an alkali developer may become so low that an exposed area is not dissolved and a desired pattern cannot be formed. t is preferably 200 or less, more preferably 100 or less from a viewpoint of the solubility of a polymer in an alkali developer. As long as t falls within this range, the photosensitive resin composition of the present invention can be used with the increased thickness, and adequate solubility in an alkali developer can be imparted.

n in general formula (1) and t in general formula (2) can be easily calculated by measuring a weight average molecular weight (Mw) using gel permeation chromatography (GPC), a light scattering method, an small angle x-ray scattering method or the like. Where the molecular weight of the repeating unit is M and the weight average molecular weight of the polymer is Mw, n=Mw/M. The repetition numbers n and t in the present invention refer to a value that is calculated using the simplest GPC measurement in terms of polystyrene.

Further, for improving adhesion with a substrate, aliphatic groups having a siloxane structure may be copolymerized with $R^1$ and/or $R^2$ in general formula (1) and $R^5$ and/or $R^6$ in general formula (2) within the boundary of not reducing heat resistance. Specifically, mention is made of those copolymerized with 1 to 10 mol % of bis(3-aminopropyl)tetramethyldisiloxane, bis(p-amino-phenyl) octamethylpentasiloxane and the like, etc. as diamine components.

A terminal sealing agent may be reacted with the terminals of the polymer having, as a main component, the structure represented by general formulae (1) and (2). The dissolution rate of resin in an aqueous alkali solution can be adjusted to a preferred range by sealing the terminals of the polymer with a monoamine having a functional group selected from the group consisting of a hydroxyl group, a carboxyl group, a sulfonic acid group and a thiol group. The dissolution rate in an aqueous alkali solution can be adjusted to a preferred range by sealing the terminals of the polymer with an acid anhydride, a monoacid chloride, a monocarboxylic acid or a mono active esterified compound.

The monoamines that are used as a terminal sealing agent are preferably 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol, 4-aminothiophenol and the like. They are used alone or in combination of two or more kinds.

Acid anhydrides, monocarboxylic acids, monoacid chloride compounds and mono active ester compounds that are used as a terminal sealing agent are preferably acid anhydrides such as phthalic anhydride, maleic anhydride, nadic acid, cyclohexanedicarboxylic anhydride and 3-hydroxyphthalic anhydride, monocarboxylic acids such as 3-carboxyphenol, 4-carboxyphenol, 3-carboxythiophenol, 4-carboxythiophenol, 1-hydroxy-7-carboxynaphthalene, 1-hydroxy-6-carboxynaphthalene, 1-hydroxy-5-carboxynaphthalene, 1-mercapto-7-carboxynaphthalene, 1-mercapto-6-carboxynaphthalene, 1-mercapto-5-carboxynaphthalene, 3-carboxybenzenesulfonic acid and 4-carboxybenzenesulfonic acid and monoacid chloride compounds with the carboxyl group of the monocarboxylic acid formed into an acid chloride, monoacid chloride compounds with only monocarboxyl group of dicarboxylic acids such as terephthalic acid, phthalic acid, maleic acid, cyclohexanedicarboxylic acid, 1,5-dicarboxynaphthalene, 1,6-dicarboxynaphthalene, 1,7-dicarboxynaphthalene and 2,6-dicarboxynaphthalene formed into an acid chloride, and active ester compounds obtained by reaction of monoacid chloride compounds with N-hydroxybenzotriazole, N-hydroxy-5-norbornene-2,3-dicarboxylmide and the like. They are used alone or in combination of two or more kinds.

The content of the terminal sealing agent such as a monoamine, an acid anhydride, a monoacid chloride, a monocarboxylic acid or a mono active ester compound is preferably 5 to 50 mol % based on the total amine content. Multiple different terminal groups may be introduced by reacting multiple terminal sealing agents.

The terminal sealing agent introduced into the polymer can be easily detected by the following method. For example, the terminal sealing agent can be easily detected by dissolving in an acidic solution a polymer containing a terminal sealing agent to separate the polymer into amine components and acid components which are constituent units of the polymer, and conducting gas chromatography (GC) and NMR measurements thereof. Alternatively, the terminal sealing agent can also be detected by directly measuring a polymer containing a terminal sealing agent by pyrolysis gas chromatography (PGC) or infrared spectrum and $^{13}$C-NMR spectrum measurements.

The polymer having, as a main component, the structure represented by general formula (1) is synthesized by the following method. In the case of the polyamide acid or polyamide acid ester, there are, for example, a method in which a tetracarboxylic dianhydride is reacted at a low temperature with a diamine compound and a monoamino compound used for sealing terminals, a method in which a diester is obtained from a tetracarboxylic dianhydride and an alcohol, and thereafter reacted with a diamine compound and a monoamino compound in the presence of a condensation agent, a method in which a diester is obtained from a tetracarboxylic dianhydride and an alcohol, and thereafter reacted with a diamine compound and a monoamino compound with the remaining dicarboxylic acid being formed into an acid chloride, and so on. In the case of the polyhydroxyamide, there is, for example, a method in which a bisaminophenol compound is made to undergo a condensation reaction with a dicarboxylic acid and a monoamino compound. Specifically, there are a method in which a dehydration-condensation agent such as dicyclohexylcarbodiimide (DCC) is reacted with an acid, where a bisaminophenol compound and a monoamino compound are added, a method in which a solution of dicarboxylic acid dichloride is added dropwise to a solution of a bisaminophenol compound and a monoamino compound with a tertiary amine such as pyridine added thereto, and so on.

It is desirable that the polymer having, as a main component, the structure represented by general formula (1), after being polymerized by the method described above, should be charged into a large amount of water methanol/water mixture or the like, precipitated, filtered off, dried and isolated. By this precipitation operation, unreacted monomers and oligomer components such as a dimer and a trimer are removed to improve film properties after heat curing.

The polymer having a structure represented by general formula (2), for use in the present invention, can be synthesized using, for example, a method in which a polyimide precursor is obtained utilizing a method of synthesizing the polymer having a structure represented by general formula (1), and then fully imidized using a known imidization reaction method, or the imidization reaction is discontinued and an imide structure is partly introduced, or a fully imidized polymer is mixed with the aforementioned polyimide precursor to thereby partly introduce an imide structure.

The imidization rate of the polymer of (a) component having a structure represented by general formula (2) can be easily determined by, for example, the following method. First, the infrared absorption spectrum of the polymer is measured to confirm the presence of absorption peaks (around 1,780 $cm^{-1}$, around 1,377 $cm^{-1}$) of the imide structure originating in the polyimide. Next, the polymer is thermally treated at 350° C. for an hour and designated as a sample having an imidization rate of 100%, and the infrared absorption spectrum is measured, and the peak strengths at around 1,377 cm$^{-1}$ of the polymer before and after the thermal treatment are compared, whereby the content of the imide group in the polymer before the thermal treatment is calculated to determine an imidization rate.

The photosensitive resin composition of the present invention may contain a polymer other than the polymer of (a) component, which may be, for example, a novolac resin. By including a novolac resin, the sensitivity and contrast can be improved. Two or more kinds of novolac resins may be contained. The novolac resin can be obtained by polycondensation of a phenol and an aldehyde using a known method.

Preferred examples of the above-mentioned phenol may include phenol, o-cresol, m-cresol, p-cresol, 2,3-xylenol, 2,5-xylenol, 3,4-xylenol, 3,5-xylenol, 2,3,5-trimethylphenol and 3,4,5-trimethylphenol. Two or more kinds of these phenols may be used. Preferred examples of the above-mentioned aldehyde may include formalin, paraformaldehyde, acetaldehyde, benzaldehyde, hydroxybenzaldehyde and chloroacetaldehyde. Two or more kinds of these aldehydes may be used. The used amount of the aldehyde is preferably 0.6 mol or more, more preferably 0.7 mol or more based on 1 mol of phenol.

The polystyrene equivalent weight average molecular weight (hereinafter referred to as "Mw") of the novolac resin is preferably 1,000 or more, more preferably 2,000 or more. It is preferably 20,000 or less, more preferably 10,000 or less. As long as the Mw falls within this range, the positive-type photosensitive resin composition of the present invention has excellent workability when applied onto a base and excellent solubility in an alkali developer.

The content of the novolac resin is preferably no less than 30 parts by weight and no more than 200 parts by weight based on 100 parts by weight of polymer of (a) component. As long as the content of the novolac resin falls within this range, sensitivity is improved.

The positive-type photosensitive resin composition of the present invention contains (b) a quinonediazide compound. The quinonediazide compounds include those with sulfonic acid of quinonediazide ester-bonded to a polyhydroxy compound, those with sulfonic acid of quinonediazide sulfoneamide-bonded to a polyamino compound, and those with sulfonic acid of quinonediazide ester-bonded and/or sulfoneamide-bonded to a polyhydroxypolyamino compound. All functional groups of these polyhydroxy compounds and polyamino compounds may not be substituted with quinonediazide, but 50 mol % or more of all functional groups is preferably substituted with quinonediazide from a viewpoint of the contrast between an exposed area and an unexposed area. By using such a quinonediazide compound, a positive-type photosensitive resin composition that is photo-sensitive to i ray (365 nm), h ray (405 nm) and g ray (436 nm) of a mercury lamp, which are common ultraviolet rays, can be obtained. In the present invention, a quinonediazide compound having any of a 5-naphthoquinonediazidesulfonyl group or a 4-naphthoquinonediazidesulfonyl group is preferably used. A selection is preferably made from 4-naphthoquinonediazidesulfonyl ester compounds and 5-naphthoquinonediazidesulfonyl ester compounds according to the wavelength of exposure light, and two or more kinds thereof may be contained. A naphthoquinonediazidesulfonyl ester compound having a 4-naphthoquinonediazidesulfonyl group and a 5-naphthoquinonediazidesulfonyl group in the same molecule may also be contained.

The polyhydroxy compounds include, but are not limited to, Bis-Z, BisP-EZ, TekP-4HBPA, TrisP-HAP, TrisP-PA, TrisP-SA, TrisOCR-PA, BisOCHP-Z, BisP-MZ, BisP-PZ, BisP-IPZ, BisOCP—IPZ, BisP-CP, BisRS-2P, BisRS-3P, BisP-OCHP, methylenetris-FR-CR, BisRS-26X, DML-MBPC, DML-MBOC, DML-OCHP, DML-PCHP, DML-PC, DML-PTBP, DML-34X, DML-EP, DML-POP, dimethylol-BisOC—P, DML-PFP, DML-PSBP, DML-MTrisPC, TriML-P, TriML-35XL, TML-BP, TML-HQ, TML-pp-BPF, TML-BPA, TMOM-BP, HML-TPPHBA, HML-TPHAP (product names, manufactured by Honshu Chemical Industry Co., Ltd.), BIR-OC, BIP-PC, BIR-PC, BIR-PTBP, BIR-PCHP, BIP-BIOC—F, 4PC, BIR-BIPC—F, TEP-BIP-A, 46DMOC, 46DMOEP, TM-BIP-A (product names, manufactured by Asahi Organic Chemicals Industry Co., Ltd.), 2,6-dimethoxymethyl-4-t-butylphenol, 2,6-dimethoxymethyl-p-cresol, 2,6-diacetoxymethyl-p-cresol, naphthol, tetrahydroxybenzophenone, gallic acid methyl ester, bisphenol A, bisphenol E, ethylenebisphenol, BisP-AP (product name, manufactured by Honshu Chemical Industry Co., Ltd.).

The polyamino compounds include, but are not limited to, 1,4-phenylenediamine, 1,3-phenylenediamine, 4,4'-diaminodiphenylether, 4,4'-diaminodiphenylmethane, 4,4'-diaminodiphenylsulfone and 4,4'-diaminodiphenylsulfide.

The polyhydroxypolyamino compounds include, but are not limited to, 2,2-bis(3-amino-4-hydroxyphenyl)hexafluoropropane and 3,3'-dihydroxybenzidine.

the molecular weight of the quinonediazide compound is preferably 350 to 1,200 inclusive.

The quinonediazide compound for use in the present invention can be obtained by, for example, a method of reacting 5-naphthoquinonediazidesulfonyl chloride with a phenol compound in the presence of triethylamine.

In the positive-type photosensitive resin composition of the present invention, the content of (b) the quinonediazide compound is preferably one part by weight or more, more preferably 3 parts by weight or more, and preferably 50 parts by weight or less, more preferably 40 parts by weight or less based on 100 parts by weight of polymer of (a) component.

The positive-type photosensitive resin composition of the present invention contains (c) a silane coupling agent having a structure represented by the following general formula (3). The silane coupling agent has an alkoxysilyl group forming a bond with a hydroxyl group on the substrate surface at a temperature of 150° C. or higher, so that a cured film having an excellent adhesion property with the substrate can be obtained by the post-development heating treatment described later. Above all, the silane coupling agent having a structure represented by the following general formula (3) has an alkoxysilyl group and an aromatic ring directly bonded together and owing to its strong bond energy, decomposition hardly occurs even though carrying out a high-temperature heating treatment at 350° C. or higher or heating treatment in the air. Thus, the adhesion property between the cured film and the substrate after high-temperature heating treatment at 350° C. or higher or after heating treatment in the air can be kept at a high level.

[Chemical Formula 12]

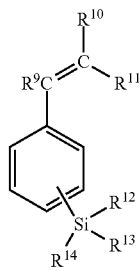

(3)

In the above general formula (3), $R^9$ to $R^{11}$ each independently represent hydrogen or an alkyl group having 1 to 3 carbon atoms. $R^{12}$ to $R^{14}$ each independently represent an alkyl group having 1 to 6 carbon atoms, an alkenyl group having 2 to 4 carbon atoms, a phenyl group, a substituted phenyl group or an alkoxyl group having 1 to 6 carbon atoms, and at least one of $R^{12}$ to $R^{14}$ is an alkoxy group having 1 to 6 carbon atoms.

Examples of the silane coupling agent having a structure represented by general formula (3) include, but are not limited to, styryldimethylmethoxysilane, styryldiethylmethoxysilane, styrylmethyldimethoxysilane, styrylethyldimethoxysilane, styryltrimethoxysilane, α-methylstyryldimethylmethoxysilane, α-methylstyryldiethylmethoxysilane, α-methylstyrylmethyldimethoxysilane, α-methylstyrylethyldimethoxysilane, α-methylstyryltrimethoxysilane, styryldimethylethoxysilane, styryldiethylethoxysilane, styrylmethyldiethoxysilane, styrylethyldiethoxysilane, styryltriethoxysilane, α-methylstyryldimethylethoxysilane, α-methylstyryldiethylethoxysilane, α-methylstyrylmethyldiethoxysilane, α-methylstyrylethyldiethoxysilane, α-methylstyryltriethoxysilane, styrylmethylmethoxyethoxysilane, styrylethylmethoxyethoxysilane, styrylmethoxydiethoxysilane and styryldimethoxyethoxysilane. Two or more kinds of these silane coupling agents may be contained.

In the positive-type photosensitive resin composition of the present invention, the content of (c) the silane coupling agent having a structure represented by general formula (3) is preferably 0.001 parts by weight or more, more preferably 0.01 parts by weight or more based on 100 parts by weight of polymer of (a) component from a viewpoint of the adhesion property after high-temperature heating treatment at 350° C. or higher or after heating treatment in the air. The content of (c) the silane coupling agent is preferably 2 parts by weight or less, more preferably 0.5 parts by weight or less, further preferably 0.3 parts by weight or less from a viewpoint of storage stability of sensitivity.

The positive-type photosensitive resin composition of the present invention contains (d) a silane coupling agent having an epoxy group, an oxetanyl group, a methacryloxy group, an acryloxy group, an amino group, an amide group or a mercapto group and having an alkoxysilyl group. Such a silane coupling agent has a functional group (epoxy group, oxetanyl group, methacryloxy group, acryloxy group, amino group, amide group or mercapto group) which easily interacts with an organic material, and therefore can considerably improve the adhesion property between the cured film and the substrate after high-temperature heating treatment at 350° C. or higher or after heating treatment in the air. Particularly, from a viewpoint of easily forming a bond with the polymer of (a) component, a silane coupling agent containing an epoxy group or an oxetanyl group is preferable, and can still further improve the adhesion property between the cured film and the substrate.

Examples of the silane coupling agent having an epoxy group, an oxetanyl group, a methacryloxy group, an acryloxy group, an amino group, an amide group or a mercapto group and an having alkoxysilyl group include, but are not limited to, N-phenylaminoethyltrimethoxysilane, N-phenylaminoethyltriethoxysilane, N-phenylaminopropyltrimethoxysilane, N-phenylaminopropyltriethoxysilane, N-phenylaminobutyltrimethoxysilane, N-phenylaminobutyltriethoxysilane, 3-methacryloxypropyltrimethoxysilane, 3-acryloxypropyltrimethoxysilane, 3-mercaptopropylmethyldimethoxysilane, 3-mercaptopropyltrimethoxysilane, 3-methacryloxypropylmethyldimethoxysilane, 3-methacryloxypropylmethyldiethoxysilane, 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane and 3-ethyl-[(triethoxysilylpropoxy)methyl]oxetane. Two or more kinds of these silane coupling agents may be contained.

In the positive-type photosensitive resin composition of the present invention, the content of (d) the silane coupling agent having an epoxy group, an oxetanyl group, a methacryloxy group, an acryloxy group, an amino group, an amide group or a mercapto group and having an alkoxysilyl group is preferably 0.01 parts by weight or more, more preferably 0.1 parts by weight or more, further preferably 1 part by weight or more, still further preferably 2 parts by weight or more based on 100 parts by weight of polymer of (a) component from a viewpoint of the adhesion property after high-temperature heating treatment at 350° C. or higher or after heating treatment in the air. The content of (d) the silane coupling agent is preferably 30 parts by weight or less, more preferably 15 parts by weight or less from a viewpoint of the mechanical property of a film after heat curing.

In the positive-type photosensitive resin composition of the present invention, the content of (d) the silane coupling agent having an epoxy group, an oxetanyl group, a methacryloxy group, an acryloxy group, an amino group, an amide group or a mercapto group and having an alkoxysilyl group is preferably 100 parts by weight or more, more preferably 200 parts by weight or more based on 100 parts by weight of (c) silane coupling agent having a structure represented by general formula (3) from a viewpoint of the adhesion property after high-temperature heating treatment at 350° C. or higher or after heating treatment in the air. The content of (d) the silane coupling agent is preferably 4,000 parts by weight or less, more preferably 2,000 parts by weight or less from a viewpoint of the mechanical property of a film after heat curing.

The positive-type photosensitive resin composition of the present invention contains (e) a solvent. The solvents include polar aprotic solvents such as N-methyl-2-pyrrolidone, γ-butyrolactone, N,N-dimethylformamide, N,N-dimethylacetamide and dimethyl sulfoxide, ethers such as tetrahydrofuran, dioxane and propylene glycol monomethyl ether, ketones such as acetone, methyl ethyl ketone, diisobutyl ketone and diacetone alcohol, esters such as ethyl acetate, propylene glycol monomethyl ether acetate and ethyl lactate, and aromatic hydrocarbons such as toluene and xylene. Two or more kinds of these solvents may be contained. The content of the solvent is preferably 50 parts by weight or more, more preferably 100 parts by weight or more, and preferably 2,000 parts by weight or less, more preferably 1,500 parts by less based on 100 parts by weight of polymer of (a) component.

The positive-type photosensitive resin composition of the present invention may contain an alkoxymethyl group-containing compound. The alkoxymethyl group undergoes a crosslinking reaction at a temperature of 150° C. or higher, and is therefore crosslinked by the post-development heating treatment described later, so that a cured film having an excellent mechanical property can be obtained. Preferable is a compound having two or more alkoxymethyl groups, and more preferable is a compound having four or more alkoxymethyl groups.

Specific examples of the alkoxymethyl group-containing compound include, but are not limited to, the following compounds. Two or more kinds thereof may be contained.

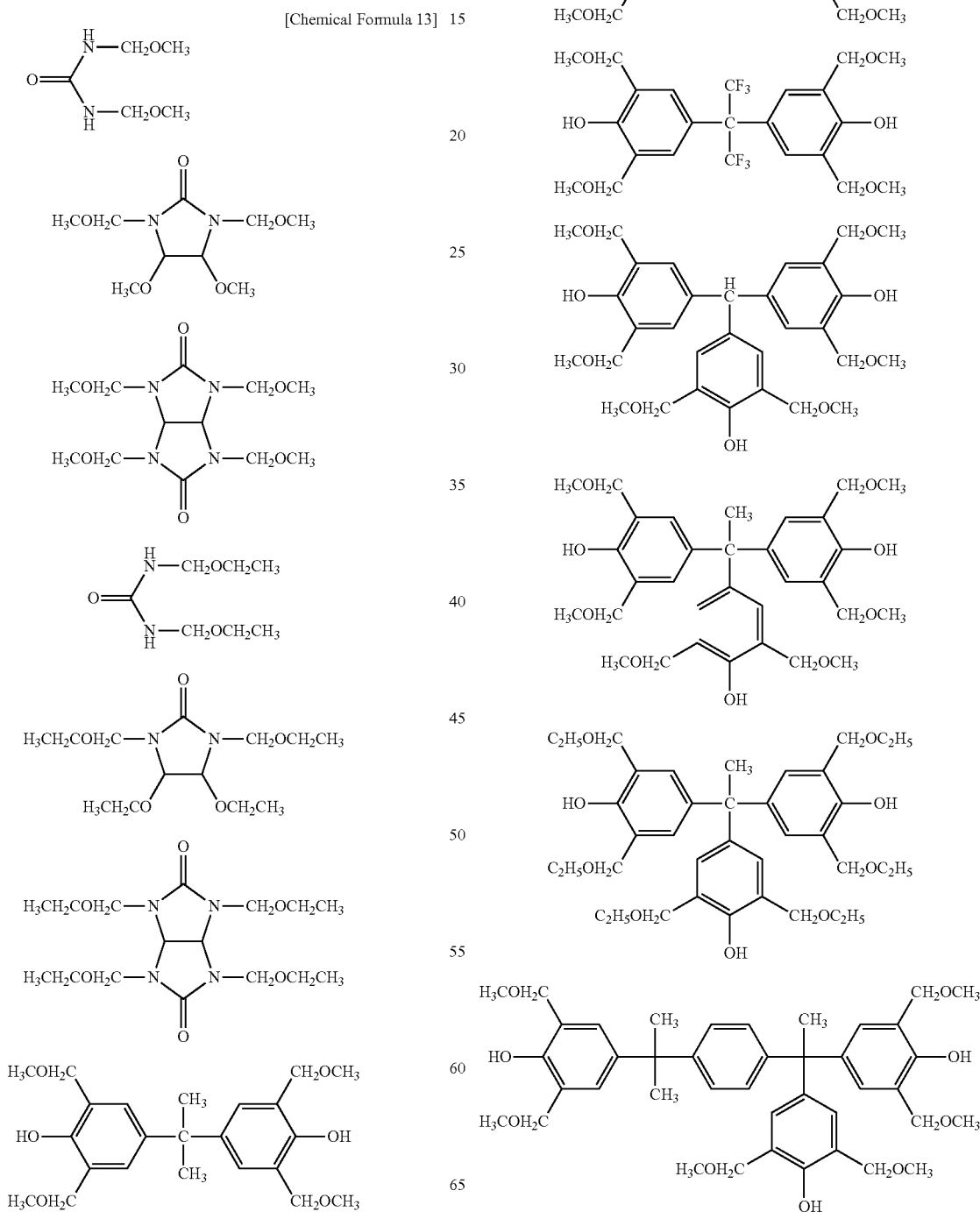

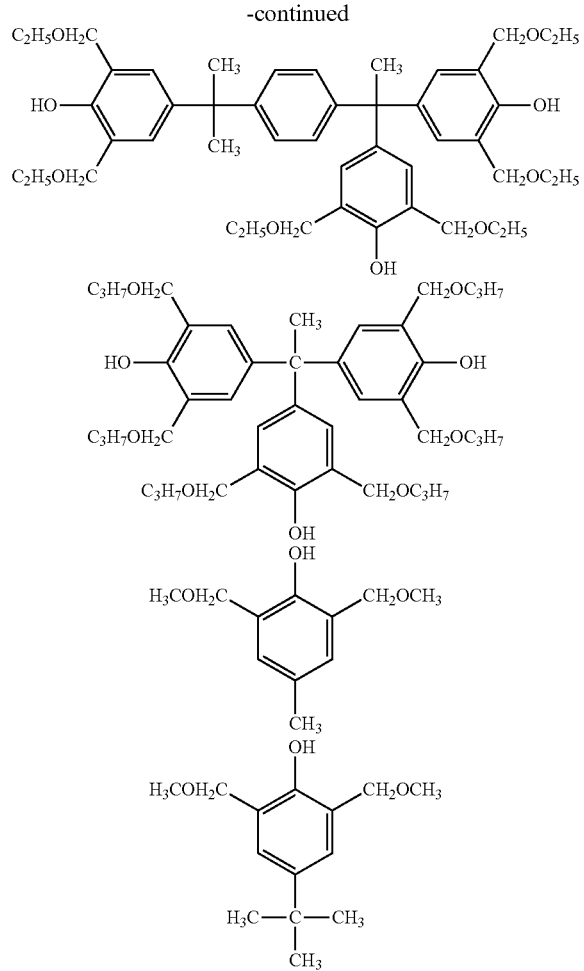

The content of the alkoxymethyl group-containing compound is preferably 10 parts by weight or more, and preferably 30 parts by weight or less based on 100 parts by weight of polymer of (a) component from a viewpoint of the mechanical property.

The positive-type photosensitive resin composition of the present invention may contain a photo acid generating agent other than (b) the quinonediazide compound. Such a photo acid generating agent is preferably a sulfonium salt, a phosphonium salt or a diazonium salt, and two or more kinds thereof may be contained. By including the photo acid generating agent, solubility in an alkali developer can be easily adjusted. Above all preferable is a sulfonium salt, and more preferable is a triarylsulfonium salt.

In the positive-type photosensitive resin composition of the present invention, the content of the photo acid generating agent other than (b) the quinonediazide compound is preferably 0.05 parts by weight or more, and preferably 10 parts by weight or less based on 100 parts by weight of polymer of (a) component.

In addition, a compound having a phenolic hydroxyl group may be contained as required, whereby the sensitivity of the positive-type photosensitive resin composition can be improved. The compounds having a phenolic hydroxyl group may include, for example, Bis-Z, TekP-4HBPA, TrisP-HAP, TrisP-PA, BisRS-2P, BisRS-3P, BIR-PC, BIR-PTBP and BIR-BIPC-F. The content of the compound having a phenolic hydroxyl group is preferably 3 parts by weight or more, and preferably 40 parts by weight or less based on 100 parts by weight of polymer of (a) component.

For the purpose of improving the wettability of the positive-type photosensitive resin composition and the substrate, a surfactant, an ester such as ethyl lactate or propylene glycol monomethyl ether acetate, an alcohol such as ethanol, a ketone such as cyclohexanone or methylisobutylketone or an ether such as tetrahydrofuran or dioxane may be contained as required. Inorganic particles such as silicon dioxide or titanium dioxide or a polyimide powder may also be contained.

A method for producing the positive-type photosensitive resin composition of the present invention is illustrated. Mention is made of, for example, a method in which (a) to (e) components, and other components as required are placed in a glass flask or a stainless container, and dissolved with stirring by a mechanical stirrer or the like, or dissolved by an ultrasonication, or dissolved with stirring by a planetary stirring and defoaming apparatus. The viscosity of the composition is preferably 1 to 10,000 mPa·s. For removing foreign matters, filtration may be carried out by a filter having a pore size of 0.1 to 5 μm.

A method for forming a cured film using the positive-type photosensitive resin composition of the present invention will now be described.

A positive-type photosensitive resin composition is applied onto a substrate. The substrate that is used is a silicon wafer, a silicon wafer sputtered with a metal, a ceramic, a gallium arsenide, metal, glass, a metal oxide insulating film, silicon nitride, ITO or the like, but is not limited thereto. Coating methods include methods such as spin coating using a spinner, spray coating, roll coating and slit die coating. The coating thickness varies depending on the coating method, the solid concentration of the composition and the viscosity, but the composition is usually coated so that the post-drying thickness is 0.1 to 150 μm.

Next, the substrate coated with the positive-type photosensitive resin composition is dried to obtain a photosensitive resin film. Drying is preferably carried out at 50° C. to 150° C. for one minute to several hours using an oven, a hot plate, an infrared ray or the like.

Next, an actinic ray is applied onto the photosensitive resin film through a mask having a desired pattern to expose the film. Actinic rays that are used for exposure include ultraviolet rays, visible light rays, electron beams and X rays, but in the present invention, the i ray (365 nm), the h ray (405 nm) and the g ray (436 nm) from a mercury lamp are preferably used.

A pattern can be formed by removing exposed areas using a developer after exposure. The developer is preferably an aqueous solution of tetramethyl ammonium, or an aqueous solution of an alkaline compound such as diethanolamine, diethylaminoethanol, sodium hydroxide, potassium hydroxide, sodium carbonate, potassium carbonate, triethylamine, diethylamine, methylamine, dimethylamine, acetic acid dimethylaminoethyl, dimethylaminoethanol, dimethylaminoethyl methacrylate, cyclohexylamine, ethylenediamine or hexamethylenediamine. In some cases, to these aqueous alkali solutions may be added one or more of polar solvents such as N-methyl-2-pyrrolidone, N,N-dimethylformamide, N,N-dimethylacetamide, dimethyl sulfoxide, γ-butyrolactone and dimethyl acrylamide, alcohols such as methanol, ethanol and isopropanol, esters such as ethyl lactate and propylene glycol monomethyl ether acetate and ketones such as cyclopentanone, cyclohexanone, isobutylketone and methylisobutylketone. A rinsing treatment is preferably carried out with water after development. Here, the rinsing treatment may be carried out with alcohols such as ethanol and isopropyl alcohol, esters such as ethyl lactate and propylene glycol monomethyl ether acetate and the like added to water.

After development, the photosensitive resin film is heated at a temperature of 200 to 500° C. and thereby converted into a cured film. In general, this heating treatment is carried out for 5 minutes to 5 hours such that a temperature is selected and the temperature is elevated stepwise, or a certain temperature range is selected and the temperature is continuously elevated. As one example, mention is made of a method in which a heat treatment is carried out at 130° C., 200° C. and 350° C. for 30 minutes, respectively, or a method in which the temperature is elevated linearly from room temperature to 400° C. for 2 hours.

The cured film formed from the positive-type photosensitive resin composition of the present invention is suitably used for applications such as passivation films of semiconductors, protective films of semiconductor devices, interlayer dielectric films of high density packaging multilayer interconnections and insulating layers of organic electro-luminescent devices.

EXAMPLES

The present invention will be described below with Examples and so on, but the present invention is not limited by these examples. Evaluations of the positive-type photosensitive resin composition in Examples were made in accordance with the following method.

(1) Evaluation of Storage Stability of Sensitivity

Preparation of Photosensitive Resin Film

A positive-type photosensitive resin composition (hereinafter referred to as varnish) was applied onto a 6 inch silicon wafer so that the film thickness was 8 µm after prebaking, and then prebaked at 120° C. for 3 minutes using a hot plate (coating-developing apparatus Mark-7 manufactured by Tokyo Electron Limited) to thereby obtain a photosensitive resin film.

Method for Measurement of Thickness

The film thickness was measured at a refraction index of 1.629 for the film after prebaking and after development and at a refraction index of 1.773 for the cured film using LAMBDA ACE STM-602 manufactured by Dainippon Screen Mfg. Co., Ltd.

Exposure

A reticle cut with a pattern was set in an exposure machine (i ray Stepper DSW-8570i manufactured by GCA Corporation), and the photosensitive resin film was exposed by the i ray at a strength of 365 nm with the exposure time being varied.

Development

A 2.38 wt % aqueous tetramethylammonium hydroxide solution was sprayed to the exposed film at 50 rotations for 10 seconds using a Mark-7 development apparatus manufactured by Tokyo Electron Limited. Thereafter, the film was left standing at 0 rotation for 70 seconds, rinsed with water at 400 rotations, and dried with shaking at 3,000 rotations for 10 seconds.

Calculation of Sensitivity

After exposure and development, an exposure time Eop 1 allowing a 50 µm line and space pattern (1L/1S) to be formed with a width ratio of 1:1 (hereinafter referred to as optimum exposure time) was determined. Next, the varnish was left standing in a yellow room (23° C., 45% RH) for an hour, and evaluations were made in the same manner as described above to determine an optimum exposure time Eop 2. A value of Eop 2-Eop 1 was then calculated, where the absolute of the value being 20 mJ/cm$^2$ or less corresponded to a good result and the absolute of the value being greater than 20 mJ/cm$^2$ corresponded a poor result. It is more preferably 10 mJ/cm$^2$ or less.

(2) Evaluation of Adhesion Property Between Film and Substrate after High-Temperature Heating Treatment at 350° C. or Higher The varnish was applied using a spinner so that the film thickness after prebaking was 10 µm, and then prebaked at 120° C. for 3 minutes using a hot plate (coating-developing apparatus D-SPIN manufactured by Tokyo Electron Limited) to thereby obtain a photosensitive resin film. The prepared photosensitive resin film was heat-treated under a nitrogen gas stream (oxygen concentration 20 ppm or less) at 170° C. for 30 minutes and then at 360° C. for an hour with the temperature elevated to 360° C. in an hour using Inert Oven 1NH-21CD manufactured by Koyo Thermo System Co., Ltd. to prepare a cured film (cured film).

The cured film was notched in the form of a 10 line/10 row grid at 2 mm intervals and subjected to a peel test with "cellotape (registered trademark)". Thereafter, a 100-hour pressure cooker test (PCT) treatment was carried out, and a peel test with "cellotape (registered trademark)" was conducted in the same manner as described above to evaluate adhesions before and after PCT. In the peel test, the number of peelings being less than 10 corresponded to a good result and the number of peelings being 10 or greater corresponded to a poor result. The PCT treatment was carried out under saturated conditions at 121° C. and 2 atm.

(3) Evaluation of Adhesion Property Between Film and Substrate after Heating Treatment in the Air A photosensitive resin film was prepared in the same manner as described in (2). The prepared photosensitive resin film was heat-treated under a nitrogen gas stream (oxygen concentration 20 ppm or less) at 170° C. for 30 minutes and then at 320° C. for an hour with the temperature elevated to 320° C. in an hour using Inert Oven 1NH-21CD manufactured by Koyo Thermo System Co., Ltd. to prepare a cured film (cured film).

The cured film was heat-treated in the air at 250° C. for 30 minutes using a hot plate, and thereafter subjected to a peel test in the same manner as described in (2). Thereafter, a PCT treatment was carried out and a peel test was conducted in the same manner as described in (2) to evaluate adhesions before and after PCT. In the peel test, the number of peelings being less than 10 corresponded to a good result and the number of peelings being 10 or greater corresponded to a poor result. The PCT treatment was carried out under saturated conditions at 121° C. and 2 atm.

Synthesis Example 1

Synthesis of Hydroxyl Group-Containing Acid Anhydride (a)

18.3 g (0.05 mol) of 2,2-bis(3-amino-4-hydroxyphenyl) hexafluoropropane (BAHF) and 34.2 g (0.3 mol) of allylglycidylether were dissolved in 100 g of gamma butyrolactone (GBL) under a dry nitrogen stream, and the solution was cooled to −15° C. Thereto were added dropwise 22.1 g (0.11 mol) of trimellitic anhydride chloride dissolved in 50 g of GBL such that the temperature of the reaction solution did not exceed 0° C. After completion of the dropwise addition, the resultant mixture was reacted at 0° C. for 4 hours. This solution was concentrated by a rotary evaporator and charged into 1 L of toluene to obtain a hydroxyl group-containing anhydride (a) represented by the following formula.

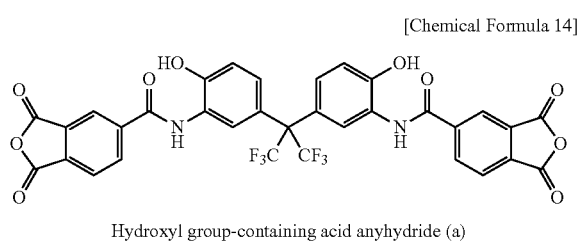 [SMILES: O=C(Nc1cc(C(c2ccc(O)c(NC(=O)c3ccc4c(c3)C(=O)OC4=O)c2)(C(F)(F)F)C(F)(F)F)ccc1O)c1ccc2c(c1)C(=O)OC2=O]

Hydroxyl group-containing acid anyhydride (a)

Synthesis Example 2

Synthesis of Hydroxyl Group-Containing Diamine Compound (b)

18.3 g (0.05 mol) of BAHF were dissolved in 100 mL of acetone and 17.4 g (0.3 mol) of propylene oxide, and the solution was cooled to −15° C. Thereto was added dropwise a solution prepared by dissolving 20.4 g (0.11 mol) of 3-nitrobenzoyl chloride in 100 mL of acetone. After completion of the dropwise addition, the resultant mixture was reacted at −15° C. for 4 hours, and then returned to room temperature. A precipitated white solid was filtered off, and dried in vacuum at 50° C.

30 g of the solid were placed in a 300 mL stainless autoclave, and dispersed in 250 mL of methyl cellosolve, and 2 g of 5% palladium-carbon were added thereto. Hydrogen was introduced thereinto by a balloon to carry out a reduction reaction at room temperature. After about 2 hours, the reaction was completed as it was confirmed that the balloon no longer deflated. After completion of the reaction, a palladium compound as a catalyst was removed by filtration, the filtrate was concentrated by a rotary evaporator, to obtain a hydroxyl group-containing diamine compound (b) represented by the following formula.

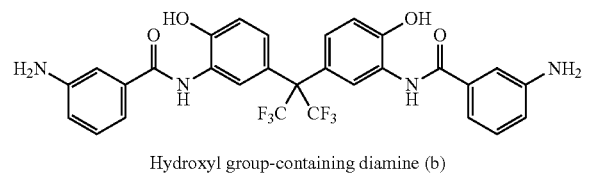

Hydroxyl group-containing diamine (b)

Synthesis Example 3

Synthesis of Hydroxyl Group-Containing Diamine (c)

15.4 g (0.1 mol) of 2-amino-4-nitrophenol were dissolved in 50 mL of acetone and 30 g (0.34 mol) of propylene oxide, and the solution was cooled to −15° C. Thereto was added dropwise a solution prepared by dissolving 11.2 g (0.055 mol) of isophthalic acid chloride in 60 mL of acetone. After completion of the dropwise addition, the resultant mixture was reacted at −15° C. for 4 hours. Thereafter, the resultant mixture was returned to room temperature and a generated precipitate was collected by filtration.

The precipitate was dissolved in 200 mL of GBL, 3 g of 5% palladium-carbon were added, and the resultant mixture was vigorously stirred. Here, a balloon containing a hydrogen gas was attached, stirring was continued until the hydrogen gas balloon no longer deflated at room temperature, and stirring was further continued for 2 hours with the hydrogen gas balloon attached. After completion of the reaction, a palladium compound was removed by filtration, and the solution was concentrated to half the original amount by a rotary evaporator. Thereto was added ethanol, and the resultant mixture was recrystallized to obtain crystals of a hydroxyl group-containing diamine (c) represented by the following formula.

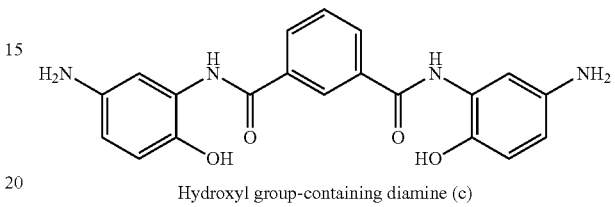

Hydroxyl group-containing diamine (c)

Synthesis Example 4

Synthesis of Hydroxyl Group-Containing Diamine (d)

15.4 g (0.1 mol) of 2-amino-4-nitrophenol were dissolved in 100 mL of acetone and 17.4 g (0.3 mol) of propylene oxide, and the solution was cooled to −15° C. Thereto was gradually added dropwise a solution prepared by dissolving 20.4 g (0.11 mol) of 4-nitrobenzoyl chloride in 100 mL of acetone. After completion of the dropwise addition, the resultant mixture was reacted at −15° C. for 4 hours. Thereafter, the resultant mixture was returned to room temperature, and a generated precipitate was collected by filtration. Thereafter, crystals of a hydroxyl group-containing diamine (d) represented by the following formula were obtained in the same manner as in Synthesis Example 2.

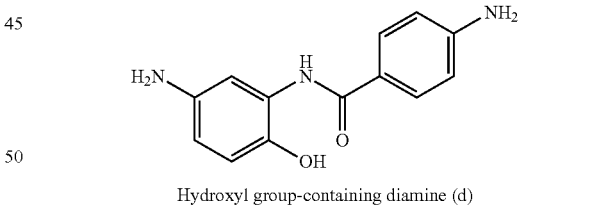

Hydroxyl group-containing diamine (d)

Synthesis Example 5

Synthesis of quinonediazide Compound (e)

16.10 g (0.05 mol) of TekP-4HBPA (product name, manufactured by Honshu Chemical Industry Co., Ltd.) and 26.86 g (0.1 mol) of 5-naphthoquinonediazidesulfonyl chloride were dissolved in 450 g of 1,4-dioxane under a dry nitrogen stream, and the solution was brought to room temperature. Thereto were added dropwise 10.12 g of triethylamine mixed with 50 g of 1,4-dioxane such that the temperature within the system was not 35° C. or higher. After the dropwise addition, the resultant mixture was stirred at 30° C. for 2 hours. The triethylamine salt was filtered, and a filtrate was charged into water. Thereafter, a generated precipitate was collected by filtration. The precipitate was dried in a vacuum dryer to obtain a quinonediazide compound (e) represented by the following formula.

[Chemical Formula 18]

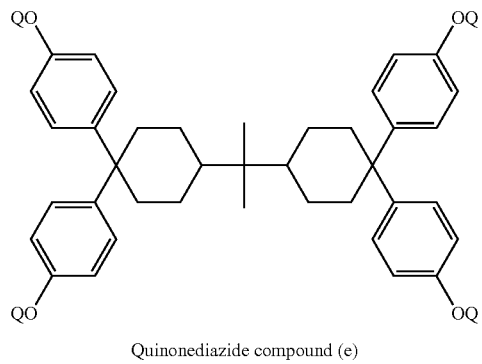

Quinonediazide compound (e)

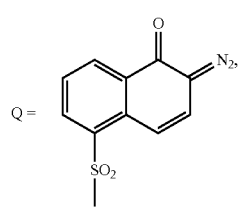

1   :   1

Synthesis Example 6

Synthesis of quinonediazide Compound (f)

15.31 g (0.05 mol) of TrisP-HAP (product name, manufactured by Honshu Chemical Industry Co., Ltd.) and 40.28 g (0.15 mol) of 5-naphthoquinonediazidesulfonyl chloride were dissolved in 450 g of 1,4-dioxane under a dry nitrogen stream, and the solution was brought to room temperature. Here, using 15.18 g of triethylamine mixed with 50 g of 1,4-dioxane, a quinonediazide compound (f) represented by the following formula was obtained in the same manner as in Synthesis Example 5.

[Chemical Formula 19]

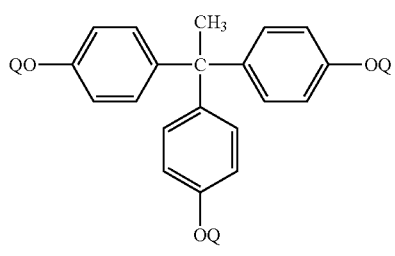

Quinonediazide compound (f)

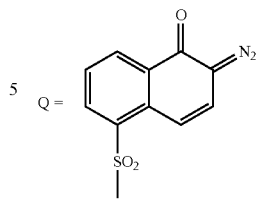

Synthesis Example 7

Synthesis of quinonediazide Compound (g)

21.22 g (0.05 mol) of TrisP-PA (product name, manufactured by Honshu Chemical Industry Co., Ltd.), 26.86 g (0.10 mol) of 5-naphthoquinonediazidesulfonyl chloride and 13.43 g (0.05 mol) of 4-naphthoquinonediazidesulfonyl chloride were dissolved in 450 g of 1,4-dioxane under a dry nitrogen stream, and the solution was brought to room temperature. Here, using 12.65 g of triethylamine mixed with 50 g of 1,4-dioxane, a quinonediazide compound (g) represented by the following formula was obtained in the same manner as in Synthesis Example 5.

[Chemical Formula 20]

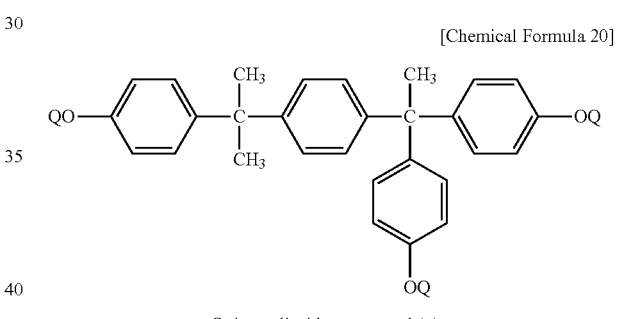

Quinonediazide compound (g)

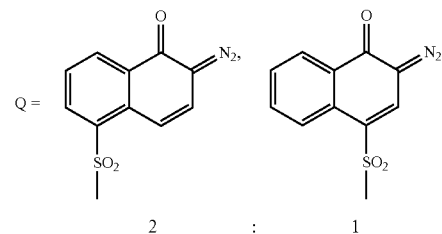

2   :   1

Synthesis Example 8

Synthesis of quinonediazide Compound (h)

11.41 g (0.05 mol) of bisphenol A and 26.86 g (0.1 mol) of 4-naphthoquinonediazidesulfonyl chloride were dissolved in 450 g of 1,4-dioxane under a dry nitrogen stream, and the solution was brought to room temperature. Here, using 10.12 g of triethylamine mixed with 50 g of 1,4-dioxane, a quinonediazide compound (h) represented by the following formula was obtained in the same manner as in Synthesis Example 5.

[Chemical Formula 21]

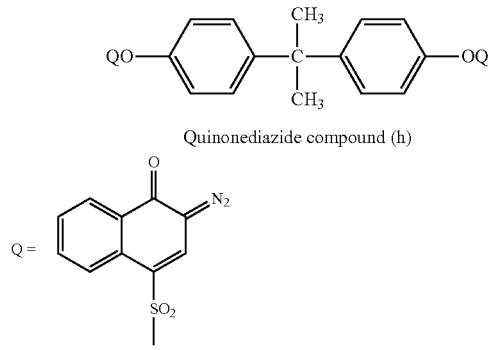

Quinonediazide compound (h)

Synthesis Example 9

Synthesis of Polymer A 4.40 g (0.022 mol) of 4,4'-diaminophenylether (DAE) and 1.24 g (0.005 mol) of 1,3-bis(3-aminopropyl)tetramethyl disiloxane (SiDA) were dissolved in 50 g of N-methyl-2-pyrrolidone (NMP) under a dry nitrogen stream. Thereto were added 21.4 g (0.030 mol) of hydroxyl group-containing acid anhydride (a) obtained in Synthesis Example 1 together with 14 g of NMP, and the resultant mixture was reacted at 20° C. for an hour, and then reacted at 40° C. for 2 hours. Thereafter, 0.65 g (0.006 mol) of 4-aminophenol were added as a terminal sealing agent, and the resultant mixture was further reacted at 40° C. for an hour. Thereafter, a solution prepared by diluting 7.14 g (0.06 mol) of N,N-dimethylformamide dimethyl acetal with 5 g of NMP was added dropwise for 10 minutes. After the dropwise addition, the resultant mixture was stirred at 40° C. for 3 hours. After completion of the reaction, the solution was charged into 2 L of water and a polymer solid precipitate was collected by filtration. The polymer solid was dried in a vacuum drier at 50° C. for 72 hours to obtain a polymer A as a polyimide precursor. The weight average molecular weight of the polymer obtained by GPC was measured to confirm that n was in the range of 10 to 100,000.

Synthesis Example 10

Synthesis of Polymer B 13.6 g (0.0225 mol) of hydroxyl group-containing diamine (b) obtained in Synthesis Example 2 were dissolved in 50 g of NMP under a dry nitrogen stream. Thereto were added 17.5 g (0.025 mol) of hydroxyl group-containing acid anhydride (a) obtained in Synthesis Example 1 together with 30 g of pyridine, and the resultant mixture was reacted at 40° C. for 2 hours. Thereafter, 0.58 g (0.005 mol) of 4-aminophenylacetylene were added as a terminal sealing agent, and the resultant mixture was further reacted at 40° C. for an hour. After completion of the reaction, the solution was charged into 2 L of water and a polymer solid precipitate was collected by filtration. The polymer solid was dried in a vacuum drier at 80° C. for 72 hours to obtain a polymer B as a polyimide precursor. The weight average molecular weight of the polymer obtained by GPC was measured to confirm that n was in the range of 10 to 100,000.

Synthesis Example 11

Synthesis of Polymer C 15.13 g (0.040 mol) of hydroxyl group-containing diamine compound (c) obtained in Synthesis Example 3 and 1.24 g (0.005 mol) of SiDA were dissolved in 50 g of NMP under a dry nitrogen stream. Thereto were added 15.51 g (0.05 mol) of 3,3',4,4'-diphenylethertetracarboxylic anhydride (ODPA) together with 21 g of NMP, and the resultant mixture was reacted at 20° C. for an hour, and then reacted at 50° C. for 2 hours. Thereafter, a solution prepared by diluting 14.7 g (0.1 mol) of N,N-dimethylformamide diethyl acetal with 15 g of NMP was added dropwise for 10 minutes. After the dropwise addition, the resultant mixture was stirred at 40° C. for 3 hours. After completion of the reaction, the solution was charged into 2 L of water and a polymer solid precipitate was collected by filtration. The polymer solid was dried in a vacuum drier at 80° C. for 72 hours to obtain a polymer C as a polyimide precursor. The weight average molecular weight of the polymer obtained by GPC was measured to confirm that n was in the range of 10 to 100,000.

Synthesis Example 12

Synthesis of Polymer D 6.08 g (0.025 mol) of hydroxyl group-containing diamine compound (d) obtained in Synthesis Example 4, 4.51 g (0.0225 mol) of DAE and 0.62 g (0.0025 mol) of SiDA were dissolved in 70 g of NMP under a dry nitrogen stream. Thereto were added 28.57 g (0.040 mol) of hydroxyl group-containing acid anhydride (a) obtained in Synthesis Example 1 and 4.41 g (0.010 mol) of 3,3',4,4'-biphenyltetracaboxylic dianhydride (BPDA) together with 25 g of NMP at room temperature, and the resultant mixture was stirred at room temperature for an hour, and then stirred at 50° C. for 2 hours. After completion of the reaction, the solution was charged into 2 L of water and a polymer solid precipitate was collected by filtration. The polymer solid was dried in a vacuum drier at 80° C. for 72 hours to obtain a polymer D as a polyimide precursor. The weight average molecular weight of the polymer obtained by GPC was measured to confirm that n was in the range of 10 to 100,000.

Synthesis Example 13

Synthesis of Polymer E 19.70 g (0.040 mol) of dicarboxylic acid derivative obtained by reacting 1 mole of diphenylether-4,4'-dicarboxylic acid dichloride (DEDC) with 2 moles of 1-hydroxybenzotriazole and 18.31 g (0.050 mol) of BAHF were dissolved in 200 g of NMP under a dry nitrogen stream, and the solution was stirred at 75° C. for 12 hours. Next, 2.96 g (0.020 mol) of maleic anhydride dissolved in 30 g of NMP were added as a terminal sealing agent, and the resultant mixture was further stirred at 75° C. for 12 hours to complete the reaction. After completion of the reaction, the solution was charged into 3 L of solution of water/methanol=3/1 and a polymer solid precipitate was collected by filtration. The polymer solid was dried in a vacuum drier at 80° C. for 20 hours to obtain a polymer E as a polybenzoxazole precursor. The weight average molecular weight of the polymer obtained by GPC was measured to confirm that n was in the range of 10 to 100,000.

Synthesis Example 14

Synthesis of Polymer F 24.82 g of 3,3',4,4'-diphenylethertetracarboxylic dianhydride, 11.86 g of s-butylalcohol, 0.40 g of triethylamine and 110.03 g of NMP were placed in a 0.5 liter flask equipped with a stirrer and a thermometer, and stirred and reacted at 60° C. for 24 hours to obtain a 3,3',4,4'-diphenylethertetracarboxylic acid di-s-butyl ester. Then, the flask was cooled to 5° C., 18.08 g of thionyl chloride were then added dropwise, and the resultant mixture was reacted for an hour to obtain a solution of 3,3',4,4'-diphenylethertetracarboxylic acid di-s-butyl ester dichloride.

Then, 47.97 g of NMP were placed in a 0.5 liter flask equipped with a stirrer, a thermometer and a Dimroth condenser, 4.33 g of 4,4'-diaminodiphenylether and 7.67 g of 3,5-diaminobenzoic acid were added, the resultant mixture was dissolved with stirring, 24.05 g of pyridine were then added, the solution of 3,3',4,4'-diphenylethertetracarboxylic acid di-s-butyl ester dichloride was added dropwise for an hour with the temperature kept at 0 to 5° C., and stirring was then continued for an hour. The solution was charged into 4 liters of water, a precipitate was collected, washed, and then dried under a reduced pressure to obtain a polymer F as a polyimide precursor. The weight average molecular weight of the polymer obtained by GPC was measured to confirm that n was in the range of 10 to 100,000.

Synthesis Example 15

Synthesis of Polymer G 29.3 g (0.08 mol) of bis(3-amino-4-hydroxyphenyl)hexafluoropropane (manufactured by Central Glass Co., Ltd., BAHF), 1.24 g (0.005 mol) of 1,3-bis(3-aminopropyl)tetramethyl disiloxane and 3.27 g (0.03 mol) of 3-aminophenol (manufactured by Tokyo Chemical Industry Co., Ltd.) as a terminal sealing agent were dissolved in 150 g of N-methyl-2-pyrrolidone (NMP) under a dry nitrogen stream. Thereto were added 31.0 g (0.1 mol) of bis(3,4-dicarboxyphenyl)ether dianhydride (manufactured by MANAC Incorporated, ODPA) together with 50 g of NMP, and the resultant mixture was stirred at 20° C. for an hour, and then stirred at 50° C. for 4 hours. Thereafter, 15 g of xylene were added, and the resultant mixture was stirred at 150° C. for 5 hours while azeotropically boiling water with xylene. After completion of stirring, the solution was charged into 3 L of water and a white precipitate was collected. The precipitate was collected by filtration, washed with water three times, and then dried in a vacuum drier at 80° C. for 20 hours to obtain a polymer G. The obtained polymer powder was measured with an infrared absorption spectrum, and absorption peaks of an imide structure originating in the polyimide were detected at around 1,780 cm$^{-1}$ and around 1,377 cm$^{-1}$. The imidization rate of the polymer powder thus obtained was 100%.

Synthesis Example 16

Synthesis of Polymer H 49.57 g (0.082 mol) of hydroxyl group-containing acid anhydride (a) obtained in Synthesis Example 1 and 5.7 g (0.035 mol) of 3-hydroxyphthalic anhydride (manufactured by Tokyo Chemical Industry Co., Ltd.) as a terminal sealing agent were dissolved in 150 g of N-methyl-2-pyrrolidone (NMP) under a dry nitrogen stream. Thereto were added 31.02 g (0.1 mol) of bis(3,4-dicarboxyphenyl)ether dianhydride together with 30 g of NMP, and the resultant mixture was stirred at 20° C. for an hour, and then stirred at 50° C. for 4 hours. Thereafter, the mixture was stirred at 180° C. for 5 hours. After completion of stirring, the solution was charged into 3 L of water and a white precipitate was collected. The precipitate was collected by filtration, washed with water three times, and then dried in a vacuum drier at 80° C. for 20 hours to obtain a polymer H. The obtained polymer powder was measured with an infrared absorption spectrum, and absorption peaks of an imide structure originating in the polyimide were detected at around 1,780 cm$^{-1}$ and around 1,377 cm$^{-1}$. The imidization rate of the polymer powder thus obtained was 100%.

Synthesis Example 17

Synthesis of Polymer I 40.5 g (0.067 mol) of hydroxyl group-containing diamine compound (b) obtained in Synthesis Example 2 and 1.24 g (0.005 mol) of 1,3-bis(3-aminopropyl)tetramethyl disiloxane were dissolved in 130 g of NMP under a dry nitrogen stream. Thereto were added 29.42 g (0.1 mol) of 3,3',4,4'-biphenyltetracarboxylic dianhydride together with 20 g of NMP, and the resultant mixture was stirred at 20° C. for an hour, and then stirred at 50° C. for 2 hours. Thereto were added 6.89 g (0.055 mol) of 4-aminothiophenol (manufactured by Tokyo Chemical Industry Co., Ltd.), and the resultant mixture was stirred at 50° C. for 2 hours, and then stirred at 180° C. for 5 hours. After completion of stirring, the solution was charged into 3 L of water and a white precipitate was collected. The precipitate was collected by filtration, washed with water three times, and then dried in a vacuum drier at 80° C. for 20 hours to obtain a polymer I. The obtained polymer powder was measured with an infrared absorption spectrum, and absorption peaks of an imide structure originating in the polyimide were detected at around 1,780 cm$^{-1}$ and around 1,377 cm$^{-1}$. The imidization rate of the polymer powder thus obtained was 100%.

Synthesis Example 18

Synthesis of Novolac Resin A 70.2 g (0.65 mol) of m-cresol, 37.8 g (0.35 mol) of p-cresol, 75.5 g of 37 wt % aqueous formaldehyde solution (formaldehyde 0.93 mol), 0.63 g (0.005 mol) of oxalic dihydrate and 264 g of methylisobutylketone were placed under a dry nitrogen stream, then immersed in an oil bath, and subjected to a polycondensation reaction for 4 hours while refluxing the reaction solution. Thereafter, the temperature of the oil bath was elevated over 3 hours, the pressure within the flask was then reduced to 4-7 kPa, volatile components were removed, and the dissolved resin was cooled to room temperature to obtain a polymer solid as a novolac resin A. From GPC, the weight average molecular weight was 3,500.

Synthesis Example 19

Synthesis of Novolac Resin B

A polymer solid as a novolac resin B was obtained in the same manner as in Synthesis Example 15 except that 108 g (1.00 mol) of m-cresol were used in place of 70.2 (0.65 mol)

of m-cresol and 37.8 g (0.35 mol) of p-cresol. From GPC, the weight average molecular weight was 4,000.

Example 1

The solid of polymer A obtained in Synthesis Example 9, which was weighed to 10 g, 2.0 g of quinonediazide compound (e) obtained in Synthesis Example 5, 0.015 g of p-styryltrimethoxysilane and 0.3 g of 3-glycidoxypropyltrimethoxysilane were dissolved in 30 g of GBL to obtain a varnish as a photosensitive polyimide precursor composition. The obtained varnish was used to evaluate the storage stability of sensitivity, the adhesion property between the film and the substrate after high-temperature heating treatment at 350° C. or higher, and the adhesion property between the film and the substrate after heating treatment in the air as described previously.

Example 2

The solid of polymer B obtained in Synthesis Example 10, which was weighed to 10 g, 2.0 g of quinonediazide compound (f) obtained in Synthesis Example 6, 0.015 g of p-styryltrimethoxysilane and 0.3 g of 3-glycidoxypropyltrimethoxysilane were dissolved in 20 g of GBL and 10 g of EL to obtain a varnish as a photosensitive polyimide precursor composition. The obtained varnish was used to evaluate the storage stability of sensitivity, the adhesion property between the film and the substrate after high-temperature heating treatment at 350° C. or higher, and the adhesion property between the film and the substrate after heating treatment in the air as described previously.

Example 3

The solid of polymer C obtained in Synthesis Example 11, which was weighed to 10 g, 2.0 g of quinonediazide compound (g) obtained in Synthesis Example 7, 0.015 g of p-styryltrimethoxysilane and 0.3 g of 3-glycidoxypropyltrimethoxysilane were dissolved in 30 g of NMP to obtain a varnish as a photosensitive polyimide precursor composition. The obtained varnish was used to evaluate the storage stability of sensitivity, the adhesion property between the film and the substrate after high-temperature heating treatment at 350° C. or higher, and the adhesion property between the film and the substrate after heating treatment in the air as described previously.

Example 4

The solid of polymer D obtained in Synthesis Example 12, which was weighed to 10 g, 2.0 g of quinonediazide compound (h) obtained in Synthesis Example 8, 0.015 g of p-styryltrimethoxysilane and 0.3 g of 3-glycidoxypropyltrimethoxysilane were dissolved in 30 g of GBL to obtain a varnish as a photosensitive polyimide precursor composition. The obtained varnish was used to evaluate the storage stability of sensitivity, the adhesion property between the film and the substrate after high-temperature heating treatment at 350° C. or higher, and the adhesion property between the film and the substrate after heating treatment in the air as described previously.

Example 5

The solid of polymer E obtained in Synthesis Example 13, which was weighed to 10 g, 2.0 g of quinonediazide compound (e) obtained in Synthesis Example 5, 0.015 g of p-styryltrimethoxysilane and 0.3 g of 3-glycidoxypropyltrimethoxysilane were dissolved in 30 g of GBL to obtain a varnish as a photosensitive polyimide precursor composition. The obtained varnish was used to evaluate the storage stability of sensitivity, the adhesion property between the film and the substrate after high-temperature heating treatment at 350° C. or higher, and the adhesion property between the film and the substrate after heating treatment in the air as described previously.

Example 6

The solid of polymer F obtained in Synthesis Example 14, which was weighed to 10 g, 2.0 g of quinonediazide compound (e) obtained in Synthesis Example 5, 0.015 g of p-styryltrimethoxysilane and 0.3 g of 3-glycidoxypropyltrimethoxysilane were dissolved in 30 g of GBL to obtain a varnish as a photosensitive polyimide precursor composition. The obtained varnish was used to evaluate the storage stability of sensitivity, the adhesion property between the film and the substrate after high-temperature heating treatment at 350° C. or higher, and the adhesion property between the film and the substrate after heating treatment in the air as described previously.

Example 7

A varnish was obtained in the same manner as in Example 1 except that p-styryltrimethoxysilane was replaced by p-styryltriethoxysilane, and the storage stability of sensitivity, the adhesion property between the film and the substrate after high-temperature heating treatment at 350° C. or higher, and the adhesion property between the film and the substrate after heating treatment in the air were evaluated as described previously.

Example 8

A varnish was obtained in the same manner as in Example 1 except that p-styryltrimethoxysilane was replaced by α-methylstyryldimethylmethoxysilane, and the storage stability of sensitivity, the adhesion property between the film and the substrate after high-temperature heating treatment at 350° C. or higher, and the adhesion property between the film and the substrate after heating treatment in the air were evaluated as described previously.

Example 9

A varnish was obtained in the same manner as in Example 1 except that 3-glycidoxypropyltrimethoxysilane was replaced by 2-(3,4-epoxycyclohexyl)ethyltrimethoxysilane, and the storage stability of sensitivity, the adhesion property between the film and the substrate after high-temperature heating treatment at 350° C. or higher, and the adhesion property between the film and the substrate after heating treatment in the air were evaluated as described previously.

Example 10

A varnish was obtained in the same manner as in Example 1 except that 3-glycidoxypropyltrimethoxysilane was replaced by 3-ethyl-[(triethoxysilylpropoxy)methyl]oxetane, and the storage stability of sensitivity, the adhesion property between the film and the substrate after high-temperature heating treatment at 350° C. or higher, and the adhesion property between the film and the substrate after heating treatment in the air were evaluated as described previously.

Comparative Example 10

A varnish was obtained in the same manner as in Example 1 except that 3-glycidoxypropyltrimethoxysilane was replaced by N-phenylaminopropyltrimethoxysilane, and the storage stability of sensitivity, the adhesion property between the film and the substrate after high-temperature heating treatment at 350° C. or higher, and the adhesion property between the film and the substrate after heating treatment in the air were evaluated as described previously.

Comparative Example 8

A varnish was obtained in the same manner as in Example 1 except that 3-glycidoxypropyltrimethoxysilane was replaced by vinyltrimethoxysilane, and the storage stability of sensitivity, the adhesion property between the film and the substrate after high-temperature heating treatment at 350° C. or higher, and the adhesion property between the film and the substrate after heating treatment in the air were evaluated as described previously.

Example 13

A varnish was obtained in the same manner as in Example 1 except that the amount of p-styryltrimethoxysilane was changed to 0.3 g, and the storage stability of sensitivity, the adhesion property between the film and the substrate after high-temperature heating treatment at 350° C. or higher, and the adhesion property between the film and the substrate after heating treatment in the air were evaluated as described previously.

Example 14

A varnish was obtained in the same manner as in Example 1 except that the amount of 3-glycidoxypropyltrimethoxysilane was changed to 0.05 g, and the storage stability of sensitivity, the adhesion property between the film and the substrate after high-temperature heating treatment at 350° C. or higher, and the adhesion property between the film and the substrate after heating treatment in the air were evaluated as described previously.

Comparative Example 9

A varnish was obtained in the same manner as in Example 1 except that the amount of 3-glycidoxypropyltrimethoxysilane was changed to 0.01 g, and the storage stability of sensitivity, the adhesion property between the film and the substrate after high-temperature heating treatment at 350° C. or higher, and the adhesion property between the film and the substrate after heating treatment in the air were evaluated as described previously.

Example 16

A varnish was obtained in the same manner as in Example 1 except that 1.0 g of "NIKALAC" MX-270 (product name, manufactured by Sanwa Chemical Co., Ltd.) and 1.0 g of HMOM-TPHAP (product name, manufactured by Honshu Chemical Industry Co., Ltd.) were added, and the storage stability of sensitivity, the adhesion property between the film and the substrate after high-temperature heating treatment at 350° C. or higher, and the adhesion property between the film and the substrate after heating treatment in the air were evaluated as described previously.

Example 17

A varnish was obtained in the same manner as in Example 1 except that the amount of polymer A obtained in Synthesis Example 9 was changed to 4 g and 6 g of novolac resin A were added, and the storage stability of sensitivity, the adhesion property between the film and the substrate after high-temperature heating treatment at 350° C. or higher, and the adhesion property between the film and the substrate after heating treatment in the air were evaluated as described previously.

Example 18

A varnish was obtained in the same manner as in Example 1 except that the amount of polymer A obtained in Synthesis Example 9 was changed to 4 g and 6 g of novolac resin B were added, and the storage stability of sensitivity, the adhesion property between the film and the substrate after high-temperature heating treatment at 350° C. or higher, and the adhesion property between the film and the substrate after heating treatment in the air were evaluated as described previously.

Example 19

A varnish was obtained in the same manner as in Example 1 except that the amount of polymer A obtained in Synthesis Example 9 was changed to 4 g and 6 g of novolac resin A, 1.0 g of "NIKALAC" MX-270 (product name, manufactured by Sanwa Chemical Co., Ltd.) and 1.0 g of HMOM-TPHAP (product name, manufactured by Honshu Chemical Industry Co., Ltd.) were added, and the storage stability of sensitivity, the adhesion property between the film and the substrate after high-temperature heating treatment at 350° C. or higher, and the adhesion property between the film and the substrate after heating treatment in the air were evaluated as described previously.

Example 20

A varnish was obtained in the same manner as in Example 1 except that the polymer G obtained in Synthesis Example 15 was added in place of the polymer A obtained in Synthesis Example 9, and the storage stability of sensitivity, the adhesion property between the film and the substrate after high-temperature heating treatment at 350° C. or higher, and the adhesion property between the film and the substrate after heating treatment in the air were evaluated as described previously.

Example 21

A varnish was obtained in the same manner as in Example 1 except that the polymer H obtained in Synthesis Example 16 was added in place of the polymer A obtained in Synthesis Example 9, and the storage stability of sensitivity, the adhesion property between the film and the substrate after high-temperature heating treatment at 350° C. or higher, and the adhesion property between the film and the substrate after heating treatment in the air were evaluated as described previously.

Example 22

A varnish was obtained in the same manner as in Example 1 except that the polymer I obtained in Synthesis Example 17 was added in place of the polymer A obtained in Synthesis Example 9, and the storage stability of sensitivity, the adhesion property between the film and the substrate after high-temperature heating treatment at 350° C. or higher, and the adhesion property between the film and the substrate after heating treatment in the air were evaluated as described previously.

Example 23

A varnish was obtained in the same manner as in Example 1 except that 4 g of polymer G obtained in Synthesis Example 15 and 6 g of novolac resin A were added in place of the polymer A obtained in Synthesis Example 9, and the storage stability of sensitivity, the adhesion property between the film and the substrate after high-temperature heating treatment at 350° C. or higher, and the adhesion property between the film and the substrate after heating treatment in the air were evaluated as described previously.

Comparative Example 1

A varnish was obtained in the same manner as in Example 1 except that 3-glycidoxypropyltrimethoxysilane was omitted, and the storage stability of sensitivity, the adhesion property between the film and the substrate after high-temperature heating treatment at 350° C. or higher, and the adhesion property between the film and the substrate after heating treatment in the air were evaluated as described previously.

Comparative Example 2

A varnish was obtained in the same manner as in Example 1 except that p-styryltrimethoxysilane was omitted, and the storage stability of sensitivity, the adhesion property between the film and the substrate after high-temperature heating treatment at 350° C. or higher, and the adhesion property between the film and the substrate after heating treatment in the air were evaluated as described previously.

Comparative Example 3

A varnish was obtained in the same manner as in Example 1 except that p-styryltrimethoxysilane was replaced by m-acetylaminophenyltrimethoxysilane, and the storage stability of sensitivity, the adhesion property between the film and the substrate after high-temperature heating treatment at 350° C. or higher, and the adhesion property between the film and the substrate after heating treatment in the air were evaluated as described previously.

Comparative Example 4

A varnish was obtained in the same manner as in Comparative Example 3 except that 3-glycidoxypropyltrimethoxysilane was replaced by N-phenylaminopropyltrimethoxysilane, and the storage stability of sensitivity, the adhesion property between the film and the substrate after high-temperature heating treatment at 350° C. or higher, and the adhesion property between the film and the substrate after heating treatment in the air were evaluated as described previously.

Comparative Example 5

A varnish was obtained in the same manner as in Comparative Example 3 except that 3-glycidoxypropyltrimethoxysilane was replaced by vinyltrimethoxysilane, and the storage stability of sensitivity, the adhesion property between the film and the substrate after high-temperature heating treatment at 350° C. or higher, and the adhesion between the film and the substrate after heating treatment in the air were evaluated as described previously.

Comparative Example 6

A varnish was obtained in the same manner as in Comparative Example 4 except that the amount of polymer A obtained in Synthesis Example 9 was changed to 4 g and 6 g of novolac resin A were added, and the storage stability of sensitivity, the adhesion property between the film and the substrate after high-temperature heating treatment at 350° C. or higher, and the adhesion property between the film and the substrate after heating treatment in the air were evaluated as described previously.

Comparative Example 7

A varnish was obtained in the same manner as in Comparative Example 4 except that the amount of polymer A obtained in Synthesis Example 9 was changed to 4 g and 6 g of novolac resin A, 1.0 g of "NIKALAC" MX-270 (product name, manufactured by Sanwa Chemical Co., Ltd.) and 1.0 g of HMOM-TPHAP (product name, manufactured by Honshu Chemical Industry Co., Ltd.) were added, and the storage stability of sensitivity, the adhesion property between the film and the substrate after high-temperature heating treatment at 350° C. or higher, and the adhesion property between the film and the substrate after heating treatment in the air were evaluated as described previously.

Alkoxymethyl group-containing compounds and other compounds used in Examples and Comparative Examples are shown below.

[Chemical Formula 22]

NIKALAC MX-270

HMOM-TPHAP

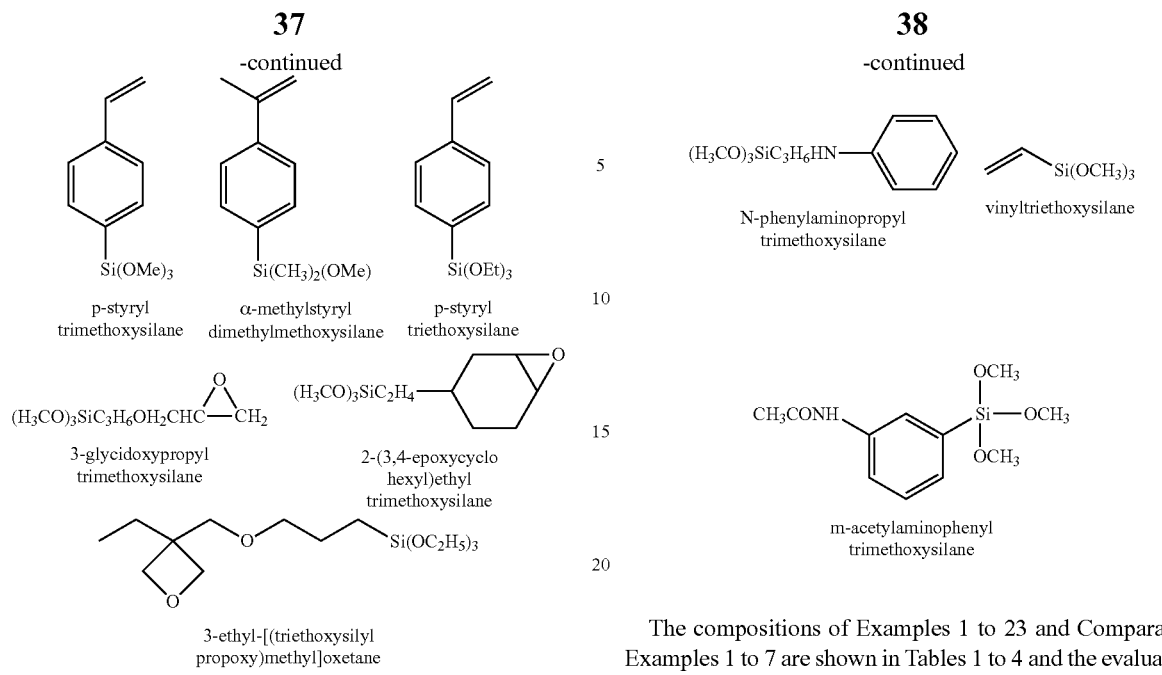

The compositions of Examples 1 to 23 and Comparative Examples 1 to 7 are shown in Tables 1 to 4 and the evaluation results are shown in Table 5.

TABLE 1

| | (a) Polymer | (b) Quinonediazide Compound | Silane coupling agent (c) | (d) | Others | Solvent | Others |
|---|---|---|---|---|---|---|---|
| Example 1 | A 10 g | Quinonediazide (e) 2.0 g | p-styryltrimethoxysilane 0.015 g | 3-glycidoxypropyltrimethoxysilane 0.3 g | — | GBL 30 g | — |
| Example 2 | B 10 g | Quinonediazide (f) 2.0 g | p-styryltrimethoxysilane 0.015 g | 3-glycidoxypropyltrimethoxysilane 0.3 g | — | GBL 20 g EL 10 g | — |
| Example 3 | C 10 g | Quinonediazide (g) 2.0 g | p-styryltrimethoxysilane 0.015 g | 3-glycidoxypropyltrimethoxysilane 0.3 g | — | NMP 30 g | — |
| Example 4 | D 10 g | Quinonediazide (h) 2.0 g | p-styryltrimethoxysilane 0.015 g | 3-glycidoxypropyltrimethoxysilane 0.3 g | — | GBL 30 g | — |
| Example 5 | E 10 g | Quinonediazide (e) 2.0 g | p-styryltrimethoxysilane 0.015 g | 3-glycidoxypropyltrimethoxysilane 0.3 g | — | GBL 30 g | — |
| Example 6 | F 10 g | Quinonediazide (e) 2.0 g | p-styryltrimethoxysilane 0.015 g | 3-glycidoxypropyltrimethoxysilane 0.3 g | — | GBL 30 g | — |
| Example 7 | A 10 g | Quinonediazide (e) 2.0 g | p-styryltriethoxysilane 0.015 g | 3-glycidoxypropyltrimethoxysilane 0.3 g | — | GBL 30 g | — |
| Example 8 | A 10 g | Quinonediazide (e) 2.0 g | α-methylstyryldimethyl methoxysilane 0.015 g | 3-glycidoxypropyltrimethoxysilane 0.3 g | — | GBL 30 g | — |
| Example 9 | A 10 g | Quinonediazide (e) 2.0 g | p-styryltrimethoxysilane 0.015 g | 2-(3,4-epoxycyclohexyl)ethyltrimethoxysilane 0.3 g | — | GBL 30 g | — |
| Example 10 | A 10 g | Quinonediazide (e) 2.0 g | p-styryltrimethoxysilane 0.015 g | 3-ethyl-[(triethoxysilylpropoxy)methyl]oxetane 0.3 g | — | GBL 30 g | — |

TABLE 2

| | (a) Polymer | (b) Quinonediazide Compound | Silane coupling agent (c) | (d) | Others | Solvent | Others |
|---|---|---|---|---|---|---|---|
| Comparative Example 10 | A 10 g | Quinonediazide (e) 2.0 g | p-styryltrimethoxysilane 0.015 g | N-phenylaminopropyltrimethoxysilane 0.3 g | — | GBL 30 g | — |

TABLE 2-continued

| | (a) Polymer | (b) Quinonediazide Compound | Silane coupling agent (c) | (d) | Others | Solvent | Others |
|---|---|---|---|---|---|---|---|
| Comparative Example 8 | A 10 g | Quinonediazide (e) 2.0 g | p-styryltrimethoxysilane 0.015 g | vinyltrimethoxysilane 0.3 g | — | GBL 30 g | — |
| Example 13 | A 10 g | Quinonediazide (e) 2.0 g | p-styryltrimethoxysilane 0.3 g | 3-glycidoxypropyltrimethoxysilane 0.3 g | — | GBL 30 g | — |
| Example 14 | A 10 g | Quinonediazide (e) 2.0 g | p-styryltrimethoxysilane 0.015 g | 3-glycidoxypropyltrimethoxysilane 0.05 g | — | GBL 30 g | — |
| Comparative Example 9 | A 10 g | Quinonediazide (e) 2.0 g | p-styryltrimethoxysilane 0.015 g | 3-glycidoxypropyltrimethoxysilane 0.01 g | — | GBL 30 g | — |
| Example 16 | A 10 g | Quinonediazide (e) 2.0 g | p-styryltrimethoxysilane 0.015 g | 3-glycidoxypropyltrimethoxysilane 0.3 g | — | GBL 30 g | NIKALAC MX-270 1.0 g HMOM-TPHAP 1.0 g |
| Example 17 | A 4 g | Quinonediazide (e) 2.0 g | p-styryltrimethoxysilane 0.015 g | 3-glycidoxypropyltrimethoxysilane 0.3 g | — | GBL 30 g | Novolac resin A 6 g |
| Example 18 | A 4 g | Quinonediazide (e) 2.0 g | p-styryltrimethoxysilane 0.015 g | 3-glycidoxypropyltrimethoxysilane 0.3 g | — | GBL 30 g | Novolac resin B 6 g |
| Example 19 | A 4 g | Quinonediazide (e) 2.0 g | p-styryltrimethoxysilane 0.015 g | 3-glycidoxypropyltrimethoxysilane 0.3 g | — | GBL 30 g | Novolac resin A 6 g NIKALAC MX-270 1.0 g HMOM-TPHAP 1.0 g |
| Example 20 | G 4 g | Quinonediazide (e) 2.0 g | p-styryltrimethoxysilane 0.015 g | 3-glycidoxypropyltrimethoxysilane 0.3 g | — | GBL 30 g | — |

TABLE 3

| | (a) Polymer | (b) Quinonediazide Compound | Silane coupling agent (c) | (d) | Others | Solvent | Others |
|---|---|---|---|---|---|---|---|
| Example 21 | H 4 g | Quinonediazide (e) 2.0 g | p-styryltrimethoxysilane 0.015 g | 3-glycidoxypropyltrimethoxysilane 0.3 g | — | GBL 30 g | — |
| Example 22 | I 10 g | Quinonediazide (e) 2.0 g | p-styryltrimethoxysilane 0.015 g | 3-glycidoxypropyltrimethoxysilane 0.3 g | — | GBL 30 g | — |
| Example 23 | G 4 g | Quinonediazide (e) 2.0 g | p-styryltrimethoxysilane 0.015 g | 3-glycidoxypropyltrimethoxysilane 0.3 g | — | GBL 30 g | Novolac resin A 6 g |

TABLE 4

| | (a) Polymer | (b) Quinonediazide Compound | Silane coupling agent (c) | (d) | Others | Solvent | Others |
|---|---|---|---|---|---|---|---|
| Comparative Example 1 | A 10 g | Quinonediazide (e) 2.0 g | p-styryltrimethoxysilane 0.015 g | — | — | GBL 30 g | — |
| Comparative Example 2 | A 10 g | Quinonediazide (e) 2.0 g | — | 3-glycidoxypropyltrimethoxysilane 0.3 g | — | GBL 30 g | — |
| Comparative Example 3 | A 10 g | Quinonediazide (e) 2.0 g | — | 3-glycidoxypropyltrimethoxysilane 0.3 g | m-acetylaminophenyltrimethoxysilane 0.015 g | GBL 30 g | — |
| Comparative Example 4 | A 10 g | Quinonediazide (e) 2.0 g | — | N-phenylaminopropyltrimethoxysilane 0.3 g | m-acetylaminophenyltrimethoxisilane 0.015 g | GBL 30 g | — |
| Comparative Example 5 | A 10 g | Quinonediazide (e) 2.0 g | — | vinyltrimethoxysilane 0.3 g | m-acetylaminophenyltrimethoxysilane 0.015 g | GBL 30 g | — |

TABLE 4-continued

| | (a) Polymer | (b) Quinonediazide Compound | (c) | Silane coupling agent (d) | Others | Solvent | Others |
|---|---|---|---|---|---|---|---|
| Comparative Example 6 | A 4 g | Quinonediazide (e) 2.0 g | — | N-phenylaminopropyl-trimethoxysilane 0.3 g | m-acetylaminophenyltri methoxysilane 0.015 g | GBL 30 g | Novolac resin A 6 g |
| Comparative Example 7 | A 4 g | Quinonediazide (e) 2.0 g | — | N-phenylaminopropyl-trimethoxysilane 0.3 g | m-acetylaminophenyltri methoxysilane 0.015 g | GBL 30 g | Novolac resin A 6 g NIKALAC MX-270 1.0 g HMOM-TPHAP 1.0 g |

TABLE 5

| | Storage stability of sensitivity | | | Adhesion property after high-temperature heating treatment at 350° C. or higher Tape peel test | | Adhesion property after heat treatment in air Tape peel test | |
|---|---|---|---|---|---|---|---|
| | Sensitivity Eop 1 (mJ/cm$^2$) | Sensitivity Eop 2 (mJ/cm$^2$) | Eop 1 – Eop 2 (mJ/cm$^2$) | Before PCT treatment | After PCT treatment | Before PCT treatment | After PCT treatment |
| Example 1 | 250 | 260 | 10 | 0/100 | 0/100 | 0/100 | 0/100 |
| Example 2 | 250 | 260 | 10 | 0/100 | 0/100 | 0/100 | 0/100 |
| Example 3 | 220 | 230 | 10 | 0/100 | 0/100 | 0/100 | 0/100 |
| Example 4 | 220 | 230 | 10 | 0/100 | 0/100 | 0/100 | 0/100 |
| Example 5 | 250 | 260 | 10 | 0/100 | 0/100 | 0/100 | 0/100 |
| Example 6 | 250 | 260 | 10 | 0/100 | 0/100 | 0/100 | 0/100 |
| Example 7 | 250 | 260 | 10 | 0/100 | 0/100 | 0/100 | 0/100 |
| Example 8 | 250 | 260 | 10 | 0/100 | 0/100 | 0/100 | 0/100 |
| Example 9 | 250 | 260 | 10 | 0/100 | 0/100 | 0/100 | 0/100 |
| Example 10 | 250 | 260 | 10 | 0/100 | 0/100 | 0/100 | 0/100 |
| Example 11 | 250 | 260 | 10 | 0/100 | 7/100 | 0/100 | 7/100 |
| Comparative Example 8 | 250 | 260 | 10 | 0/100 | 7/100 | 0/100 | 7/100 |
| Example 13 | 250 | 265 | 15 | 0/100 | 0/100 | 0/100 | 0/100 |
| Example 14 | 250 | 260 | 10 | 0/100 | 8/100 | 0/100 | 8/100 |
| Comparative Example 9 | 250 | 260 | 10 | 0/100 | 10/100 | 0/100 | 10/100 |
| Example 16 | 220 | 230 | 10 | 0/100 | 0/100 | 0/100 | 0/100 |
| Example 17 | 150 | 150 | 0 | 0/100 | 0/100 | 0/100 | 0/100 |
| Example 18 | 150 | 150 | 0 | 0/100 | 0/100 | 0/100 | 0/100 |
| Example 19 | 120 | 120 | 0 | 0/100 | 0/100 | 0/100 | 0/100 |
| Example 20 | 380 | 390 | 10 | 0/100 | 0/100 | 0/100 | 0/100 |
| Example 21 | 380 | 390 | 10 | 0/100 | 0/100 | 0/100 | 0/100 |
| Example 22 | 380 | 390 | 10 | 0/100 | 0/100 | 0/100 | 0/100 |
| Example 23 | 300 | 300 | 0 | 0/100 | 0/100 | 0/100 | 0/100 |
| Comparative Example 1 | 250 | 260 | 10 | 0/100 | 80/100 | 0/100 | 80/100 |
| Comparative Example 2 | 250 | 260 | 10 | 0/100 | 7/100 | 0/100 | 90/100 |
| Comparative Example 3 | 250 | 280 | 30 | 0/100 | 0/100 | 0/100 | 0/100 |
| Comparative Example 4 | 250 | 280 | 30 | 0/100 | 40/100 | 0/100 | 40/100 |
| Comparative Example 5 | 250 | 280 | 30 | 0/100 | 40/100 | 0/100 | 40/100 |
| Comparative Example 6 | 150 | 170 | 20 | 0/100 | 50/100 | 0/100 | 50/100 |
| Comparative Example 7 | 120 | 140 | 20 | 0/100 | 50/100 | 0/100 | 50/100 |

INDUSTRIAL APPLICABILITY

According to the present invention, there can be obtained a positive-type photosensitive resin composition having excellent storage stability, particularly excellent photo sensitivity stability. In addition, by the positive-type photosensitive resin composition of the present invention, there can be obtained a cured film having an excellent adhesion property with a substrate after high-temperature heating treatment at 350° C. or higher or after heating treatment in the air.

The invention claimed is:
1. A positive-type photosensitive resin composition which comprises:

(a) a polymer having, as a main component, a structure represented by the following general formula (1) and/or a polymer having, as a main component, a structure represented by the following general formula (2),
(b) a quinonediazide compound,
(c) a silane coupling agent having a structure represented by the following general formula (3),
(d) a silane coupling agent having an epoxy, or an oxetanyl group, and
(e) a solvent,
wherein the positive-type photosensitive resin composition comprises 100 to 4,000 parts by weight of (d) the silane coupling agent having an epoxy, or an oxetanyl group, and having an alkoxysilyl group based on 100 parts by weight of (c) the silane coupling agent having a structure represented by general formula (3);

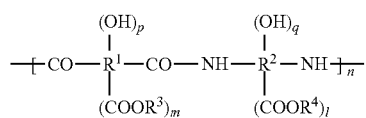
(1)

wherein in the above general formula (1), $R^1$ and $R^2$ each independently represent a bi- to octavalent organic group having two or more carbon atoms;
$R^3$ and $R^4$ each independently represent hydrogen or a monovalent organic group having 1 to 20 carbon atoms;
n represents a number in the range of 10 to 100,000,
l and m each independently represent an integer of 0 to 2, and
p and q each independently represent an integer of 0 to 4, where p+q>0;

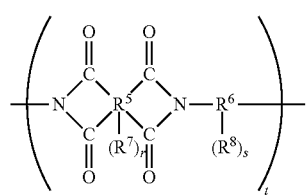
(2)

wherein in the above general formula (2), $R^5$ represents a tetra- to decavalent organic group and $R^6$ represents a bi- to octavalent organic group;

$R^7$ and $R^8$ represent a phenolic hydroxyl group, a sulfonic acid group or a thiol group, and may each be a single group or a combination of different groups;
t represents a number in the range of 3 to 100,000, and r and s represent an integer of 0 to 6;

(3)

wherein in the above general formula (3), $R^9$ to $R^{11}$ each independently represent hydrogen or an alkyl group having 1 to 3 carbon atoms; and
$R^{12}$ to $R^{14}$ each independently represent an alkyl group having 1 to 6 carbon atoms, an alkenyl group having 2 to 4 carbon atoms, a phenyl group, a substituted phenyl group or an alkoxyl group having 1 to 6 carbon atoms, and at least one of $R^{12}$ to $R^{14}$ is an alkoxyl group having 1 to 6 carbon atoms.

2. The positive-type photosensitive resin composition according to claim 1, wherein (d) the silane coupling agent has the epoxy group.

3. The positive-type photosensitive resin composition according to claim 1, wherein the positive-type photosensitive resin composition comprises 0.001 to 2 parts by weight of (c) the silane coupling agent having a structure represented by general formula (3) based on 100 parts by weight of (a) the polymer having, as a main component, a structure represented by general formula (1) and/or polymer having, as a main component, a structure represented by general formula (2).

4. The positive-type photosensitive resin composition according to claim 1, wherein the positive-type photosensitive resin composition comprises 0.01 to 30 parts by weight of (d) the silane coupling agent having an epoxy group or an oxetanyl group, and having an alkoxysilyl group based on 100 parts by weight of (a) the polymer having, as a main component, a structure represented by general formula (1) and/or polymer having, as a main component, a structure represented by general formula (2).

* * * * *